United States Patent
Nakamura

(10) Patent No.: US 10,788,076 B2
(45) Date of Patent: Sep. 29, 2020

(54) ROTATION MECHANISM, MACHINE TOOL, AND SEMICONDUCTOR MANUFACTURING DEVICE

(71) Applicant: NSK Ltd., Shinagawa-ku, Tokyo (JP)

(72) Inventor: Tsuyoshi Nakamura, Kanagawa (JP)

(73) Assignee: NSK LTD., Shinagawa-ku, Tokyo (JP)

( * ) Notice: Subject to any disclaimer, the term of this patent is extended or adjusted under 35 U.S.C. 154(b) by 492 days.

(21) Appl. No.: 15/102,348

(22) PCT Filed: Dec. 24, 2014

(86) PCT No.: PCT/JP2014/084169
§ 371 (c)(1),
(2) Date: Jun. 7, 2016

(87) PCT Pub. No.: WO2015/107845
PCT Pub. Date: Jul. 23, 2015

(65) Prior Publication Data
US 2017/0037907 A1    Feb. 9, 2017

(30) Foreign Application Priority Data

Jan. 14, 2014   (JP) .................. 2014-004632
Jan. 28, 2014   (JP) .................. 2014-013801
(Continued)

(51) Int. Cl.
*F16C 41/00*    (2006.01)
*F16C 19/54*    (2006.01)
(Continued)

(52) U.S. Cl.
CPC ............. *F16C 41/005* (2013.01); *B23Q 1/70* (2013.01); *B23Q 11/0046* (2013.01);
(Continued)

(58) Field of Classification Search
CPC .......... F16C 41/005; F16C 17/08; B23Q 1/38; B23Q 1/70; B23Q 11/46
(Continued)

(56) References Cited

U.S. PATENT DOCUMENTS 3,735,824 A * 5/1973 Astrom ............ B23Q 1/015
                                                175/213
4,075,927 A * 2/1978 Frazier ............ B23B 31/261
                                                279/142
(Continued)

FOREIGN PATENT DOCUMENTS

CN     86102491 A  *  9/1987 ........... F01D 25/186
CN      2460801 Y      11/2001
(Continued)

OTHER PUBLICATIONS

JP 2002061750 A Translation.*
(Continued)

*Primary Examiner* — Hemant Desai
*Assistant Examiner* — Veronica Martin
(74) *Attorney, Agent, or Firm* — Sughrue Mion, PLLC

(57) ABSTRACT

A rotation mechanism includes: a housing; a shaft inserted through a hole provided at the housing; bearings installed at the housing and rotatably supporting the shaft; a rotary member provided at one end portion of the shaft, adapted to be rotated together with the shaft, and having a portion that projects to a radially outer side of the hole and faces the housing with a gap having a predetermined size; and a gas passage adapted to connect the gap to outside of the housing and allow gas contained in a portion of the gap to pass to the outside of the housing.

13 Claims, 15 Drawing Sheets

(30) Foreign Application Priority Data

Feb. 13, 2014 (JP) ................................ 2014-025850
Mar. 7, 2014 (JP) ................................ 2014-045255

(51) Int. Cl.

| | | |
|---|---|---|
| H01L 21/687 | (2006.01) | |
| H02K 5/173 | (2006.01) | |
| F16C 32/06 | (2006.01) | |
| F16C 39/04 | (2006.01) | |
| H02K 5/16 | (2006.01) | |
| H02K 5/124 | (2006.01) | |
| H02K 9/04 | (2006.01) | |
| F16C 21/00 | (2006.01) | |
| F16J 15/40 | (2006.01) | |
| F16C 17/08 | (2006.01) | |
| B23Q 11/08 | (2006.01) | |
| B23Q 1/70 | (2006.01) | |
| B23Q 11/00 | (2006.01) | |
| H01L 21/683 | (2006.01) | |
| H02K 9/14 | (2006.01) | |

(52) U.S. Cl.

CPC .......... *B23Q 11/0883* (2013.01); *F16C 17/08* (2013.01); *F16C 19/543* (2013.01); *F16C 21/00* (2013.01); *F16C 32/0614* (2013.01); *F16C 32/0622* (2013.01); *F16C 32/0692* (2013.01); *F16C 39/04* (2013.01); *F16J 15/40* (2013.01); *H01L 21/6838* (2013.01); *H01L 21/68792* (2013.01); *H02K 5/124* (2013.01); *H02K 5/16* (2013.01); *H02K 5/1735* (2013.01); *H02K 9/04* (2013.01); *H02K 9/14* (2013.01); *F16C 2235/00* (2013.01); *F16C 2300/22* (2013.01); *F16C 2322/39* (2013.01); *F16C 2380/18* (2013.01)

(58) Field of Classification Search

USPC .......................... 173/197, 213, 217, 171, 198
See application file for complete search history.

(56) References Cited

U.S. PATENT DOCUMENTS

| | | | | |
|---|---|---|---|---|
| 4,656,951 A * | 4/1987 | Kimura | ................... | B23Q 1/38 108/20 |
| 4,660,838 A | 4/1987 | Katayama et al. | | |
| 5,139,095 A * | 8/1992 | Lyon | ........................ | E21B 4/14 175/100 |
| 5,145,298 A * | 9/1992 | Marantette | ............... | B23Q 1/70 279/51 |
| 5,239,892 A | 8/1993 | Sakai | | |
| 5,310,341 A * | 5/1994 | Byer | ........................ | A61C 3/02 433/116 |
| 5,553,948 A | 9/1996 | Ito | | |
| 5,833,522 A * | 11/1998 | Niino | ...................... | B23Q 1/38 451/294 |
| 6,227,307 B1 * | 5/2001 | Lee | ........................ | B25D 17/11 173/162.1 |
| 8,038,385 B2 * | 10/2011 | Kawai | ...................... | B23Q 1/38 415/110 |
| 2002/0093141 A1 * | 7/2002 | Wang | ..................... | F16J 15/348 277/358 |
| 2003/0178785 A1 * | 9/2003 | Egashira | ........... | H01L 21/67126 277/500 |
| 2007/0243057 A1 * | 10/2007 | Shimada | ........... | H01L 21/68785 414/792.8 |
| 2008/0024034 A1 * | 1/2008 | Koizumi | ................ | H02K 5/128 310/266 |
| 2010/0050942 A1 * | 3/2010 | Kato | ...................... | C23C 16/401 118/730 |
| 2010/0329807 A1 * | 12/2010 | Tatsuda | .................... | B23Q 1/70 409/231 |
| 2011/0236180 A1 * | 9/2011 | Nelson | .................... | F01C 13/02 415/1 |
| 2012/0279736 A1 * | 11/2012 | Tanimoto | ................ | B25B 21/02 173/2 |
| 2013/0277065 A1 * | 10/2013 | Hallundbæk | ......... | E21B 43/121 166/372 |
| 2014/0193283 A1 * | 7/2014 | Ohyama | ................. | F04C 25/02 418/1 |
| 2015/0015097 A1 * | 1/2015 | Shin | ........................ | H02K 55/04 310/57 |
| 2016/0290510 A1 * | 10/2016 | Nakamura | ........... | F16J 15/3284 |
| 2017/0081757 A1 * | 3/2017 | Kurita | .................... | C23C 16/042 |
| 2017/0287696 A1 * | 10/2017 | Noda | .................... | C23C 16/455 |

FOREIGN PATENT DOCUMENTS

| | | | | |
|---|---|---|---|---|
| CN | 102628541 A | * | 8/2012 | ............. F16M 11/06 |
| CN | 103827527 A | * | 5/2014 | ......... F16C 32/0614 |
| CN | 105556184 A | * | 5/2016 | ............ F16C 33/766 |
| EP | 3073160 A1 | | 9/2016 | |
| JP | 63-169253 U | | 11/1988 | |
| JP | 04-047937 U | | 4/1992 | |
| JP | 07-217655 A | | 8/1995 | |
| JP | 09-150336 A | | 6/1997 | |
| JP | 2000-018248 A | | 1/2000 | |
| JP | 2000-100907 A | | 4/2000 | |
| JP | 2001-221345 A | | 8/2001 | |
| JP | 2002-061750 A | | 2/2002 | |
| JP | 2002061750 A | * | 2/2002 | ............... F16J 15/34 |
| JP | 2004-197786 A | | 7/2004 | |
| JP | 2005-249079 A | | 9/2005 | |
| JP | 2008-175273 A | | 7/2008 | |
| JP | 2008175273 A | * | 7/2008 | ............... F16J 15/40 |
| JP | 2009-216200 A | | 9/2009 | |
| JP | WO 2013018272 A1 | * | 2/2013 | ............. F04C 25/02 |

OTHER PUBLICATIONS

JP 2008175273 A Translation.*
Communication dated Mar. 6, 2017 issued by the State Intellectual Property Office of People's Republic of China in counterpart application No. 201480067249.2.
Communication dated Nov. 28. 2016 issued by the State Intellectual Property Office of People's Republic of China in the related application No. 201480051893.0.
Communication dated Mar. 22, 2017 issued by the European Patent Office in the related EP application No. 14864251.5.
International Search Report for PCT/JP2014/084169 dated Mar. 24, 2015 [PCT/ISA/210].
Written Opinion for PCT/JP2014/084169 dated Mar. 24, 2015 [PCT/ISA/237].
Notice of Reasons for Refusal (corresponding to PCT/JP2014/084169) issued in the corresponding Japanese application No. 2014-045255 dated Feb. 9, 2015.
Notice of Reasons for Refusal (corresponding to PCT/JP2014/084169) issued in the corresponding Japanese application No. 2014-013801 dated Mar. 10, 2015.
Notice of Reasons for Refusal (corresponding to PCT/JP2014/084169) issued in the corresponding Japanese application No. 2015-099326 dated Apr. 14, 2016.

* cited by examiner

A-A

B-B

C-C

D-D

ROTATION MECHANISM, MACHINE TOOL, AND SEMICONDUCTOR MANUFACTURING DEVICE

CROSS REFERENCE TO RELATED APPLICATIONS

This application is a National Stage of International Application No. PCT/JP2014/084169 filed Dec. 24, 2014, claiming priority based on Japanese Patent Application Nos. 2014-004632 filed Jan. 14, 2014, 2014-013801 filed Jan. 28, 2014, 2014-025850 filed Feb. 13, 2014 and 2014-045255 filed Mar. 7, 2014, the contents of all of which are incorporated herein by reference in their entirety.

FIELD

The present invention relates to a rotation mechanism, a machine tool, and a semiconductor manufacturing device.

BACKGROUND

In a conveyance device, a semiconductor manufacturing device, a machine tool, or the like, a rotation mechanism that rotates a rotary stage or rotates a tool or a workpiece is used. As such a rotation mechanism, for example, a spindle with static pressure gas bearing is disclosed in Patent Literature 1. According to this spindle with static pressure gas bearing, a chuck sleeve and a bearing sleeve are vertically fitted into a sleeve fitting hole of a housing, and an exhaust space formed between both of the sleeves is made to communicate with the outside through an exhaust passage provided at the housing. A table for supporting a workpiece is fitted to an upper end of a main spindle. The chuck sleeve is provided with a suction passage in communication with a workpiece adsorption recessed portion formed at the table. Compressed gas supplied into a radial bearing gap between the main spindle and the bearing sleeve is exhausted to the outside from the exhaust space and the exhaust passage.

CITATION LIST

Patent Literature

Patent Literature 1: Japanese Laid-open Patent Publication No. 7-217655

SUMMARY

Technical Problem

According to the technology disclosed in Patent Literature 1, in the case where compressed gas flows into a gap between a chuck sleeve and a main spindle, the compressed gas is prevented from flowing out over the housing by sucking the compressed gas into a suction passage formed at the chuck sleeve, thereby preventing dust contained in the compressed gas supporting the main spindle from adhering to a surface of a workpiece placed on a table. However, a foreign matter may enter between the main spindle and the chuck sleeve from the outside of the main spindle, and may affect supporting of the main spindle.

The present invention is directed to suppressing entrance of a foreign matter from the outside of a shaft included in a rotation mechanism.

Solution to Problem

According to the present invention, there is provided a rotation mechanism comprising: a housing; a shaft inserted through a hole provided at the housing; a bearing installed at the housing and configured to rotatably support the shaft; a rotary member provided at one end portion of the shaft, configured to be rotated together with the shaft, and having a portion that projects to a radially outer side of the hole and faces the housing with a gap having a predetermined size; and a gas passage configured to connect the gap to outside of the housing and allow gas contained in a portion of the gap to pass to the outside of the housing.

In the rotation mechanism, the portion of the rotary member that projects to radially outer side of the hole into which the shaft is inserted faces the housing with the gap having the predetermined size, and allows the gas contained in the portion of the gap to pass to the outside of the housing from the gas passage. With this structure, the rotation mechanism exhausts the gas contained in the gap from a more outer side of the rotation mechanism than a portion between the hole and shaft. Therefore, entrance of a foreign matter from the outside of the shaft can be suppressed.

Preferably, the bearing is a rolling bearing including an outer ring, an inner ring disposed on a radially inner side of the outer ring, and a rolling element disposed between the outer ring and the inner ring, and a space surrounded by the hole and the shaft is opened on the rotary member side and between the outer ring and the inner ring. With this structure, the gas contained inside the housing is exhausted to the outside of the housing, passing through between the outer ring and the inner ring of the bearing, the space, gap, and the gas passage. Thus, since the space surrounded by the hole and shaft can exhaust heat generated at the bearing to the outside of the housing, temperature increase at the bearing can be suppressed.

Preferably, the housing includes, inside, an electric motor having a rotor connected to the other end portion of the shaft, and cooling gas is supplied to the electric motor. With this structure, temperature increase at the electric motor can be suppressed.

Preferably, a groove extending in a circumferential direction of the hole is provided in at least one of a portion located in the housing and facing the rotary member and a portion located in the rotary member and facing the housing, and the gas passage connects the gap to the outside of the housing at a position of the groove. Since the groove is provided around the hole, the gas contained in the gap is exhausted to the outside of the housing from the entire groove. Due to this operation, entrance of a foreign matter and outflow of the dust contained inside the housing can be effectively suppressed in the rotation mechanism.

Preferably, the groove is provided at a portion located in the housing and facing the rotary member, and the gas passage is provided in the housing and opened to the groove in the rotary member. Consequently, entrance of a foreign matter and outflow of the dust contained inside the housing can be effectively suppressed.

Preferably, a plurality of the grooves is provided in a radial direction of the hole. The rotation mechanism includes the plurality of grooves in the radial direction of the housing, thereby improving sealing function. Moreover, the rotation mechanism can effectively suppress entrance of a foreign matter from the outside of the shaft by the plurality of grooves. Furthermore, when the gap between the rotary member and the housing is cleaned with liquid such as cleaning liquid, the cleaning liquid can be supplied from the grooves on outer side, and the cleaning liquid can be collected from the grooves on the outer side and an inner side of the housing. With this structure, the rotation mechanism can suppress entrance of the cleaning liquid into the bearing.

Preferably, the groove is provided at a portion located in the rotary member and facing the housing, and the gas passage is provided in the housing and opened to a position located in the housing and facing the groove. With this structure, mass of the rotary member is reduced. Therefore, inertia moment of the rotary member can be reduced.

Preferably, a plurality of the grooves is provided in a radial direction of the hole. The rotation mechanism includes the plurality of grooves in the radial direction of the housing, thereby improving sealing function. Moreover, the rotation mechanism can effectively suppress entrance of a foreign matter from the outside of the shaft by the plurality of grooves. Furthermore, when the gap between the rotary member and the housing is cleaned with liquid such as cleaning liquid, the cleaning liquid can be supplied from the grooves on outer side, and the cleaning liquid can be collected from the grooves on the outer side and an inner side of the housing. With this structure, the rotation mechanism can suppress entrance of the cleaning liquid to the bearing.

Preferably, a through-hole penetrating the rotary member in a thickness direction is provided, and gas is exhausted from the rotary member on an opposite side of the housing through the through-hole, the gap, and the gas passage. With this structure, an adsorption mechanism such as a vacuum chuck can be provided at the rotary member by utilizing the gas passage.

Preferably, the housing includes other gas passage different from the gas passage, and the other gas passage different from the gas passage allows gas contained in a portion of the gap to pass to the outside of the housing. In the case where the adsorption mechanism such as the vacuum chuck is provided at the rotary member, the rotation mechanism sucks, from the gas passage, the gas from a suction mechanism and can exhaust the gas contained in the gap from the gas passage to the outside of the housing. Since the gas contained in the gap is exhausted also from the other gas passage, an exhausting amount of the gas from the gap is reduced in the gas passage for the adsorption mechanism. As a result, a flow rate at an exhaust system of the adsorption mechanism can be reduced. Furthermore, since pressure loss at the exhaust system of the adsorption mechanism is reduced, chuck pressure can be increased.

Preferably, the housing includes a passage to suck gas from between the housing and the shaft. Entrance of the cleaning liquid on the bearing side can be suppressed by sucking the gas from between the housing and the shaft while the gap is cleaned with the cleaning liquid.

Preferably, the rotation mechanism includes a supply passage configured to connect the gap to the outside of the housing and supply gas to a portion of the gap from a portion located on a more radially outer side of the hole than the gas passage. The rotation mechanism can suppress entrance of a foreign matter such as liquid from the outside of the housing into the radially inner side of the gap by the gas supplied to the gap from the supply passage. Furthermore, since the gas from the supply passage is exhausted from the gas passage to the outside of the housing, the rotation mechanism can suppress high-pressure gas supplied from the supply passage from flowing into the inside of the housing.

Preferably, the rotation mechanism includes a first groove provided at least at one of a portion located in the housing and facing the rotary member and a portion located in the rotary member and facing the housing, and extending in a circumferential direction of the hole; and a second groove provided at least at one of a portion located in the housing and facing the rotary member and a portion located in the rotary member and facing the housing, and disposed on a more radially outer side of the hole than the first groove, and extending in a circumferential direction of the hole, wherein the gas passage connects the gap to the outside of the housing at a position of the first groove, and the supply passage connects the gap to the outside of the housing at a portion of the second groove.

The rotation mechanism can efficiently fill the high-pressure gas to the gap across a rotary member and an entire peripheral area of the housing, and also can efficiently exhaust the gas from the gap, by using the first groove and the second groove.

Preferably, the rotation mechanism includes a third groove provided at least at one of a portion located in the housing and facing the rotary member and a portion located in the rotary member and facing the housing, and also the third groove being positioned between the first groove and the second groove, extending in a circumferential direction of the hole, and being connected to the outside of the housing. In the rotation mechanism, the high-pressure gas flowing out to the gap from the supply passage is collected in the third groove and can be emitted to the outside of the housing. Therefore, a flow rate of the high-pressure gas supplied from the supply passage to flow in the gas passage can be reduced.

Preferably, the rotation mechanism includes, in the housing, an opening portion opened on a more radially outer side of the hole than the gas passage, facing the rotary member, and extending in a circumferential direction of the hole, wherein the supply passage is connected to the opening portion. In the rotation mechanism, the high-pressure gas supplied from the supply passage through the opening portion is exhausted to the radially outer side of the housing. Therefore, a flow rate of the high-pressure gas flowing in the exhaust passage can be reduced after supplied from the supply passage.

A machine tool according to the present invention includes the above-described rotation mechanism. Therefore, entrance of a foreign matter from outside of a shaft included in the machine tool can be suppressed.

A semiconductor manufacturing device according to the present invention includes the above-described rotation mechanism. Therefore, entrance of a foreign matter from outside of a shaft included in the semiconductor manufacturing device can be suppressed.

Advantageous Effects of Invention

The present invention can suppress entrance of a foreign matter from the outside of the shaft included in the rotation mechanism.

DESCRIPTION OF EMBODIMENTS

In the following, modes to implement the present invention (hereinafter referred to as embodiments) will be described with reference to the drawings.

Figure 1:
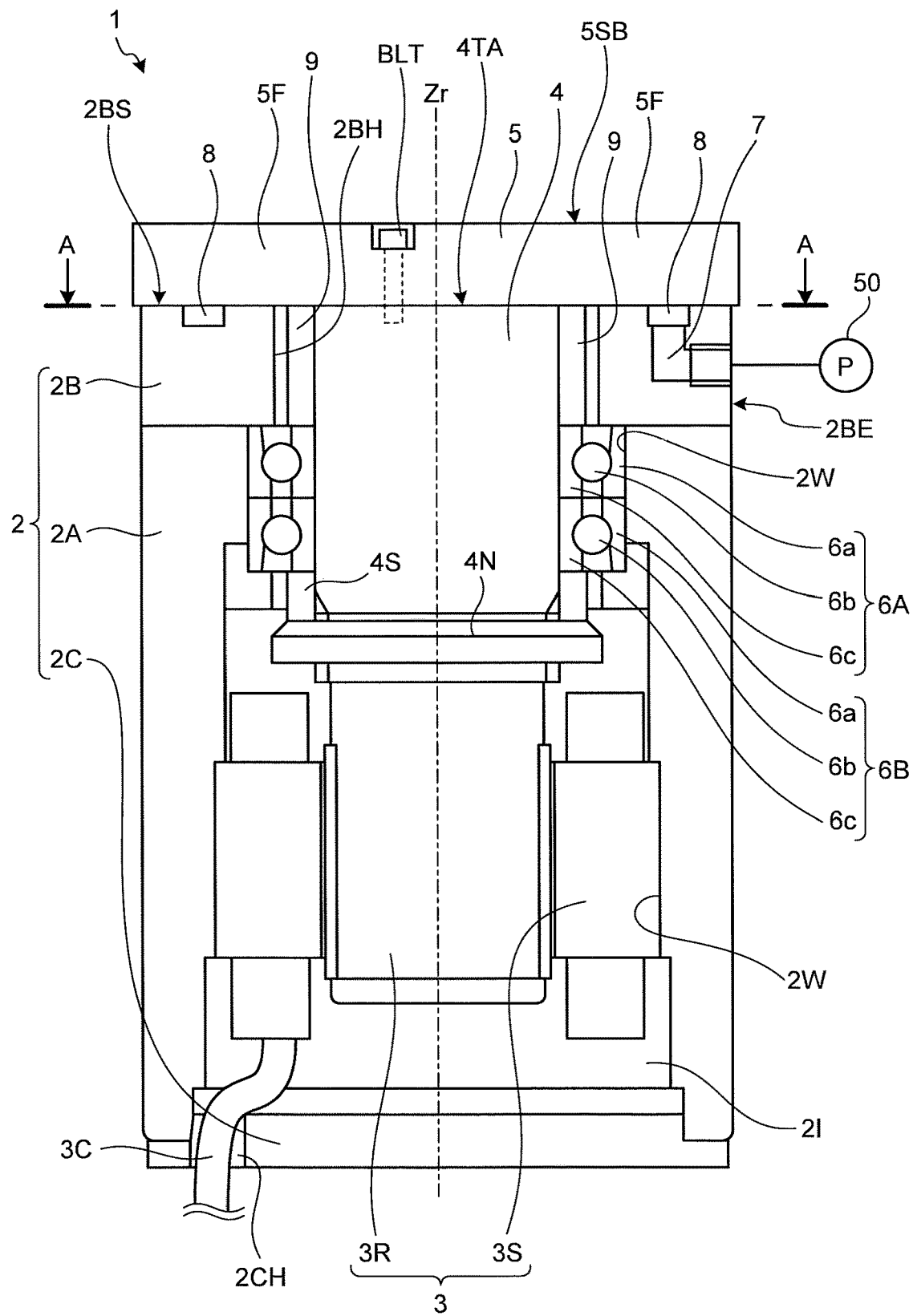
FIG. 1 is a cross-sectional view illustrating a rotation mechanism according to a first embodiment.
Figure 2:
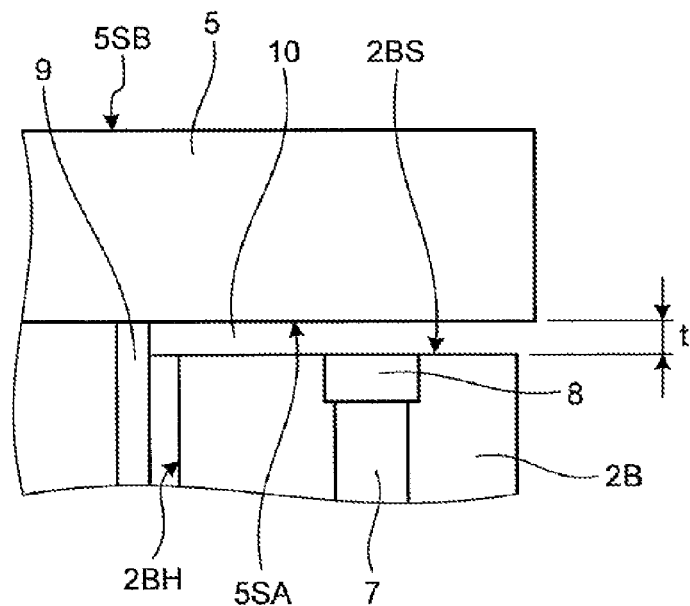
FIG. 2 is an enlarged view illustrating a gap in the rotation mechanism according to the first embodiment.
Figure 3:
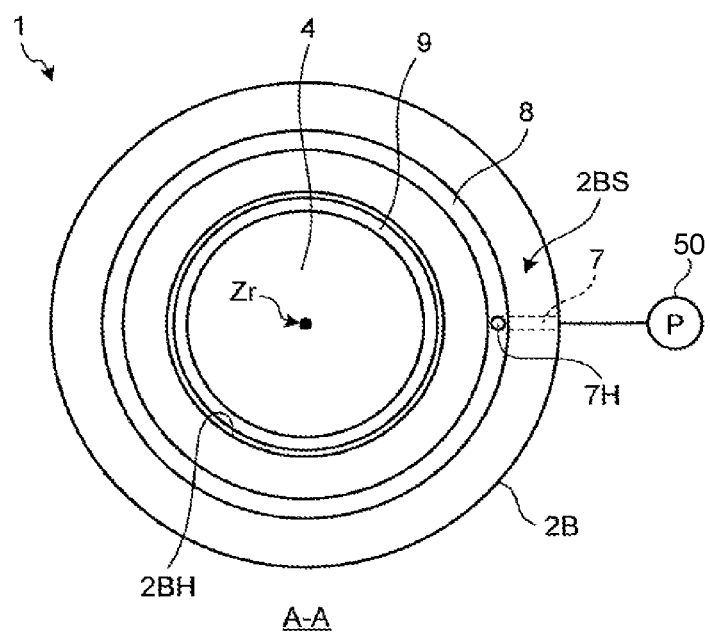
FIG. 3 is a view taken along an arrow A-A in FIG. 1.

FIG. 1 is a cross-sectional view illustrating a rotation mechanism according to a first embodiment. FIG. 1 shows a cross-section illustrating a rotation mechanism 1 taken along a plane including a rotational center axis Zr of the rotation mechanism 1 and parallel to the rotational center axis Zr. FIG. 2 is an enlarged view illustrating a gap in the rotation mechanism according to the first embodiment. FIG. 3 is a view taken along an arrow A-A in FIG. 1. The rotation mechanism 1 is a machine element that transmits rotation, and is applied to, for example, in a machine tool, a conveyance device used under a special environment such as a vacuum chamber, a semiconductor manufacturing device, a flat panel display manufacturing device, or the like. Here, as an example, a description will be given for a case where the rotation mechanism 1 is a spindle unit including a spindle as a rotary shaft, but an object to which the rotation mechanism 1 is applied is not limited thereto.

The rotation mechanism 1 includes a housing 2, a shaft 4, bearings 6A, 6B, a rotary member 5, and a gas passage 7. The housing 2 is a member to house the bearings 6A, 6B. In the present embodiment, the housing 2 includes a side portion 2A having a cylindrical shape, a first member 2B provided at one end portion of the side portion 2A, and a second member 2C provided at the other end portion of the side portion 2A. The side portion 2A, first member 2B, and second member 2C constitute part of the housing 2. In the present embodiment, the side portion 2A is a cylindrical member, and includes a through-hole 2I that runs from one end portion to the other end portion, more specifically, from the first member 2B to the second member 2C.

Both of the first member 2B and the second member 2C are plate-like members. In the present embodiment, the first member 2B and the second member 2C each have a circle shape in a planar view, but the shape is not limited thereto. The first member 2B includes the rotational center axis Zr of the shaft 4, and also includes a hole 2BH penetrating in a thickness direction. The second member 2C includes a through-hole 2CH. A power supply cable 3C is inserted through the through-hole 2CH. The power supply cable 3C supplies power to an electric motor 3 provided inside the housing 2, more specifically, at a portion surrounded by the side portion 2A, first member 2B, and second member 2C.

The shaft 4 is an output shaft of the rotation mechanism 1 and passes through the first member 2B by being inserted into the housing 2, more specifically, the hole 2BH provided at the first member 2B of the housing 2. The bearings 6A, 6B are installed at the housing 2, in the present embodiment, inside of the housing 2, and adapted to rotatably support the shaft 4. In the present embodiment, the shaft 4 is supported at the housing 2 by the two bearings 6A, 6B, but the number of the bearings is not limited to two.

The bearings 6A, 6B each include an outer ring 6a, a rolling element 6b, and an inner ring 6c. The inner ring 6c is arranged on a radially inner side of the outer ring 6a. Thus, in the present embodiment, both of the bearings 6A, 6B are rolling bearings. The rolling element 6b is disposed between the outer ring 6a and the inner ring 6c. The bearings 6A, 6B each have the outer ring 6a contacting an inner wall 2W of the through-hole 2I included in the side portion 2A of the housing 2. With this structure, the bearings 6A, 6B are attached to the housing 2. In the present embodiment, both of the bearings 6A, 6B are ball bearings, but the type of the bearings 6A, 6B as the rolling bearings is not limited to the ball bearing. Furthermore, in the present embodiment, both of the bearings 6A, 6B are the rolling bearings, but may also be slide bearings.

The rotary member 5 is provided at one end portion 4TA of the shaft 4, and is rotated together with the shaft 4. The rotary member 5 has an object loaded on a surface 5SB located on an opposite side of the one end portion 4TA of the shaft 4. In the present embodiment, the rotary member 5 is a plate-like member and has a circle shape in a planar view. The rotary member 5 projects to a radially outer side of the hole 2BH provided at the first member 2B of the housing 2. A portion 5F that projects to the radially outer side of the hole 2BH (hereinafter, conveniently referred to as a flange portion) faces the housing 2 with a predetermined gap 10 as illustrated in FIG. 2.

The gap 10 is formed between a surface 2BS of the first member 2B included in the housing 2 and facing the rotary member 5 and a surface 5SA located at the rotary member 5 and facing the first member 2B. The gap 10 is a sealing portion to seal a space between the inside and the outside of the housing 2. The gap 10 illustrated in FIG. 2 has a size t from several μm to several tens of μm, for example.

The gas passage 7 is provided at a portion located in the housing 2 and facing the rotary member 5, more specifically, the first member 2B of the housing 2. The gas passage 7 connects a surface 2BS located in the first member 2B and facing the rotary member 5 to a side portion 2BE linked to the surface 2BS, and the gas passage passes through the first member 2B. With this structure, the gas passage 7 connects the gap 10 to the outside of the housing 2, and allows gas contained in the gap 10 portion to pass to the outside of the housing 2. In the present embodiment, an exhaust device 50 is connected to the gas passage 7. The exhaust device 50 sucks and exhausts the gas contained inside the gas passage 7 (in the present embodiment, air). The exhaust device 50 is, for example, a pump.

In the present embodiment, as illustrated in FIGS. 1, 2, and 3, a groove 8 is formed on the surface 2BS that is a portion of the first member 2B included in the housing 2 and faces the rotary member 5. The groove 8 extends in a circumferential direction of the hole 2BH included in the first member 2B as illustrated in FIG. 3. Further, as illustrated in FIGS. 1, 2, and 3, the gas passage 7 is opened to the groove 8. More specifically, the gas passage 7 is opened to a bottom portion of the groove 8. In FIG. 3, an opening portion 7H of the gas passage 7 is illustrated.

In the present embodiment, the number of gas passage 7 included in the rotation mechanism 1 is one, but the number thereof is not limited thereto. In the case where the rotation mechanism 1 includes a plurality of gas passages 7, preferably, the gas passages 7 are provided at equal intervals around the rotational center axis Zr. The gas contained in the gap 10 passes and is exhausted from the gas passage 7 to the outside of the housing 2, and exhausting balance of the gas is improved by disposing the plurality of gas passages 7 at equal intervals. Therefore, disposing the plurality of gas passages 7 at equal intervals is preferable.

The electric motor 3 is provided inside the housing 2. The electric motor 3 includes a rotor 3R, and a stator 3S provided on a radially outer side of the rotor 3R. The stator 3S is attached to the inner wall 2W of the through-hole 2I included in the side portion 2A. The rotor 3R is connected to the other end portion of the shaft 4. With this structure, the rotor 3R, shaft 4 and rotary member 5 are integrally rotated around the rotational center axis Zr. In the present embodiment, a form of the electric motor 3 is not limited.

In the present embodiment, as described above, the gas contained in the gap 10 is exhausted from the gas passage 7 to the outside of the housing 2, thereby suppressing entrance of a foreign matter into between the shaft 4 and the housing 2 from the outside of the rotation mechanism 1, entrance of a foreign matter into the bearings 6A, 6B, and outflow of dust from the inside of housing 2 to the outside of the rotation mechanism 1. The dust flowing out from the inside of the housing 2 may include dust from the bearings 6A, 6B and dust from the electric motor 3, for example. As described later, the rotation mechanism 1 does not necessarily include the groove 8, but since the groove 8 is provided around the hole 2BH, the gas contained in the gap 10 is exhausted from the entire groove 8 to the outside of the housing. Due to this action, entrance of a foreign matter and outflow of the dust contained inside the housing 2 can be effectively suppressed in the rotation mechanism 1. Therefore, in the rotation mechanism 1, a mechanical bearing, such as a rolling bearing or a slide bearing, which does not require any gas supply can be used for the bearings 6A, 6B.

In the case of using the rolling bearings for the bearings 6A, 6B, displacement of the shaft 4 in a direction of the gap 10 caused by a reason other than a load from an object loaded on the rotary member 5 is suppressed. Therefore, sealing performance can be improved by making the size t of the gap 10 small. The size t of the gap 10 is determined while allowing predetermined tolerance relative to accuracy of the shaft 4 (deflection in a sealing surface direction), flatness and perpendicularity with respect to the shaft 4 of the sealing surface on the housing 2 side. The mentioned sealing surface is, on the housing 2 side, the surface 2BS of the first member 2B located on the rotary member 5 side, and also on the rotary member 5 side, is the surface 5SA of the rotary member 5 located on the first member 2B side.

In the rotation mechanism 1, the inner ring 6c of the bearing 6A contacts an annular spacer 9 which is provided at shaft 4 on the rotary member 5 side. The rotary member 5 and the shaft 4 are fastened and fixed with a bolt BLT, for example, as illustrated in FIG. 1. The spacer 9 is disposed between the bearing 6A and the rotary member 5. In the bearing 6A, the outer ring 6a contacts the first member 2B of the housing 2. Furthermore, the inner ring 6c of the bearing 6A contacts the inner ring 6c of the bearing 6B, and also the annular spacer 4S contacts the inner ring 6c of the bearing 6B. In this state, a lock nut 4N is screwed into the shaft 4 from the spacer 4S side. The spacer 4S is disposed at the shaft 4 on the electric motor 3 side.

Since the lock nut 4N is screwed and fastened, the bearings 6A, 6B are fixed between the spacer 4S and the spacer 9 and furthermore between the lock nut 4N and the rotary member 5. When the bearings 6A, 6B are attached to the inner wall 2W of the side portion 2A of the housing 2, the outer ring 6a of the bearing 6A contacts the first member 2B of the housing 2. Then a position of the shaft 4 is determined in the rotational center axis Zr direction. Thus, in the rotation mechanism 1, reference of the shaft 4 in the rotational center axis Zr direction is located on the rotary member 5 side. With this structure, there is a merit that a posture and a position of the rotary member 5 and the size t of the gap 10 are hardly affected by heat deformation of the shaft 4, such as extension in the rotational center axis Zr direction.

In the present embodiment, the shaft 4 and the bearings 6A, 6B are attached to the housing 2 in the following procedure, for example. First, the bearings 6A, 6B are attached to the housing 2, more specifically, the inner wall 2W of the side portion 2A. Next, the rotary member 5 is attached to the one end portion 4TA with the spacer 9 being attached to the shaft 4 on the one end portion 4TA side. In this state, the shaft 4 is made to pass through the hole 2BH of the first member 2B of the housing 2 from the other end portion thereof, and inserted into the inner ring 6c of the bearings 6A, 6B. After the shaft 4 is inserted into the bearings 6A, 6B, the spacer 4S is attached to the shaft 4, and then the lock nut 4N is screwed from the other end portion of the shaft 4 to attach the shaft 4 to the bearings 6A, 6B.

The spacer 9 and the shaft 4 are disposed inside the hole 2BH of the first member 2B of the housing 2. In the present embodiment, the spacer 9 and the spacer 4S attached to the shaft 4 are also deemed as the part of the shaft 4. A space surrounded by the hole 2BH and spacer 9, namely, the shaft 4 is opened to the rotary member 5 side of the first member 2B and also between the outer ring 6a and the inner ring 6c in each of the bearings 6A, 6B. The space connects the gap 10 to an area between the outer ring 6a and the inner ring 6c in each of the bearings 6A, 6B. With this structure, the gas contained inside the housing 2 can be moved to the gap 10 through the space, passing through the area between the outer ring 6a and the inner ring 6c in each of the bearings 6A, 6B. Therefore, the gas contained in the gap 10 is sucked and exhausted by the exhaust device 50, thereby allowing the gas contained inside the housing 2 to be exhausted to the outside of the housing 2 through the area between the outer ring 6a and the inner ring 6c in each of the bearings 6A, 6B, space, gap 10, and gas passage 7. Thus, the above-described space can exhaust the heat generated at the electric motor 3 and the bearings 6A, 6B to the outside of the housing 2. Therefore, temperature increase in these components can be suppressed. As a result, since heat deformation of the bearings 6A, 6B and the shaft 4 is suppressed, the rotation mechanism 1 can achieve high rotation accuracy. Furthermore, since the above-described heat deformation is suppressed, the rotation mechanism 1 can allow the electric motor 3 and the shaft 4 to be rotated with high acceleration/deceleration or at a high speed accompanying heat generation.

In the rotation mechanism 1, the rolling bearings are used for the bearings 6A, 6B. The bearings 6A, 6B each have the outer ring 6a attached to the inner wall 2W of the side portion 2A of the housing 2 and the inner ring 6c attached to the shaft 4. In this structure, a gap between the shaft 4 and the hole 2BH provided at the first member 2B of the housing 2 is needed to be controlled in order to secure sealing inside the housing 2. To achieve this, an axial center on the housing 2 side and an axial center of the shaft 4 supported by the bearings 6A, 6B are needed to be aligned. To align the both shaft center, high processing accuracy is required for the housing. Therefore, in the case of using a bearing such as a rolling bearing and a slide bearing, other than a hydrostatic bearing, in the rotation mechanism 1, it is effective to form the gap 10 between the rotary member 5 and the first member 2B of the housing 2 in order to improve sealing efficiency.

When gas supply is stopped by power failure or the like, the hydrostatic bearing loses a function as the bearing. Therefore, in the case of providing a sealing gap between the first member 2B and the rotary member 5, the sealing gap is needed to be formed larger than a gap of the hydrostatic bearing. Therefore, in the case of using the hydrostatic bearing, the sealing gap is hardly formed smaller than a predetermined size. In the present embodiment, the bearings 6A, 6B are the rolling bearings, and the rolling bearings are hardly affected by power failure or the like, unlike the hydrostatic bearing. Therefore, in the rotation mechanism 1, in the case of using the rolling bearings for the bearings 6A, 6B, the size t of the gap 10 can be formed small in a range that the rotary member 5 does not contact the first member 2B. Consequently, sealing efficiency is improved.

In the rotation mechanism 1, preferably, a diameter of the rotary member 5 is set larger than a diameter of the first member 2B of the housing 2 in order to suppress entrance of a liquid-state foreign matter into the gap 10 while rotation of the shaft 4 is stopped. The gap 10 may also be cleaned by, for example, supplying cleaning liquid such as solvent from a passage connected to the groove 8, such as the gas passage 7 or a passage provided separately from the gas passage 7. In the present embodiment, the side portion 2A and the first member 2B are separate components in the housing 2, but not limited to this structure. For instance, the side portion 2A and the first member 2B are may be manufactured as an integrated structure by a manufacturing method such as casting.

Modified Example

Figure 4:
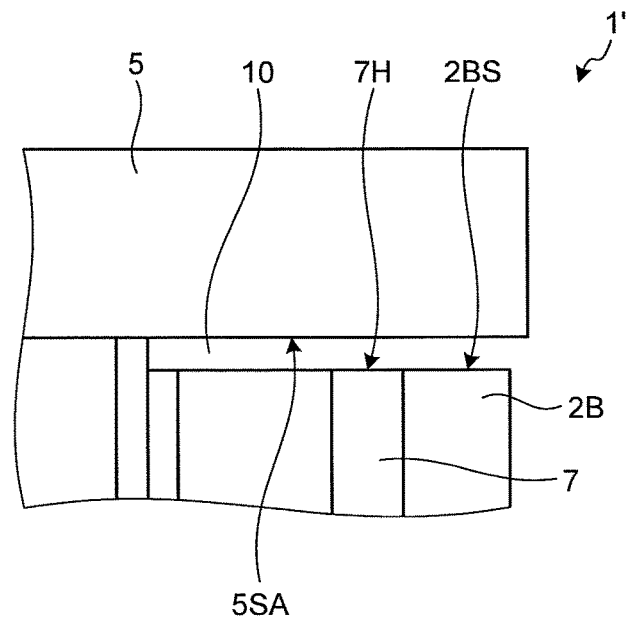
FIG. 4 is an enlarged view illustrating a rotation mechanism according to a modified example of the first embodiment.
Figure 5:
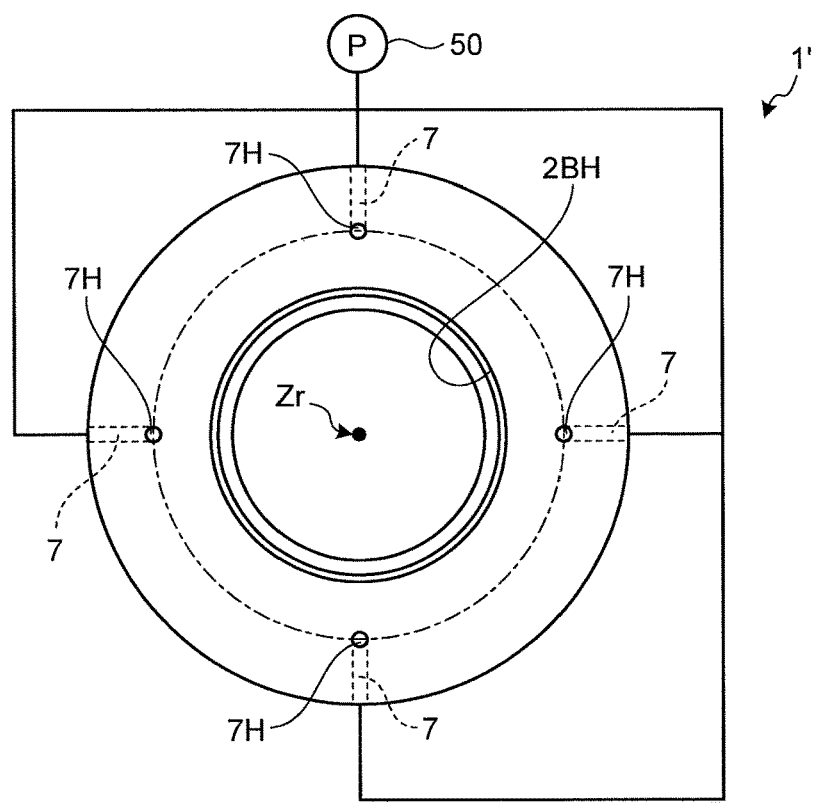
FIG. 5 is a plan view illustrating the rotation mechanism according to the modified example of the first embodiment.

FIG. 4 is an enlarged view illustrating a rotation mechanism according to a modified example of the first embodiment. FIG. 5 is a plan view illustrating the rotation mechanism according to the modified example of the first embodiment. FIG. 5 illustrates a state in which a rotation mechanism 1' is viewed from a position corresponding to the arrow A-A in FIG. 1. The rotation mechanism 1' is substantially the same as the rotation mechanism 1 of the first embodiment, but different in not including the groove 8. Since the rotation mechanism 1' does not include the groove 8 illustrated in FIG. 3 and the like in the first member 2B, the gas passage 7 is directly opened to the surface 2BS of the first member 2B on the rotary member 5 side. As illustrated in FIG. 5, in the present modified example, the first member 2B of the rotation mechanism 1' includes a plurality of gas passages (four in this example). In FIG. 5, opening portions 7H in the respective gas passages 7 are illustrated.

With this structure also, the gas contained in the gap 10 is exhausted to the outside of the housing 2 from the gas passages 7 by the exhaust device 50 in the rotation mechanism 1'. Therefore, the same operation and effects as the rotation mechanism 1 of the first embodiment can be obtained. Since the rotation mechanism 1' does not need to provide the groove 8 in the first member 2B, there is a merit that manufacturing becomes easy.

Furthermore, gas having pressure higher than gas around the housing 2 may also be supplied to the gap 10 from the gas passages 7. Consequently, the gap 10 is sealed because the gas supplied from the gas passages 7 flows out to a radially outer side of the rotary member 5 and the first member 2B of the housing 2. As a result, entrance of liquid and the like into the gap 10 from the outside of the housing 2 can be suppressed.

The first embodiment and the modified example thereof have been described above, but the structures of the first embodiment and the modified example thereof can be suitably applied to following embodiments as well. In this case, only a partial structure of the first embodiment and the modified example thereof may be applied or all of the structures may be applied as well.

Second Embodiment

Figure 6:
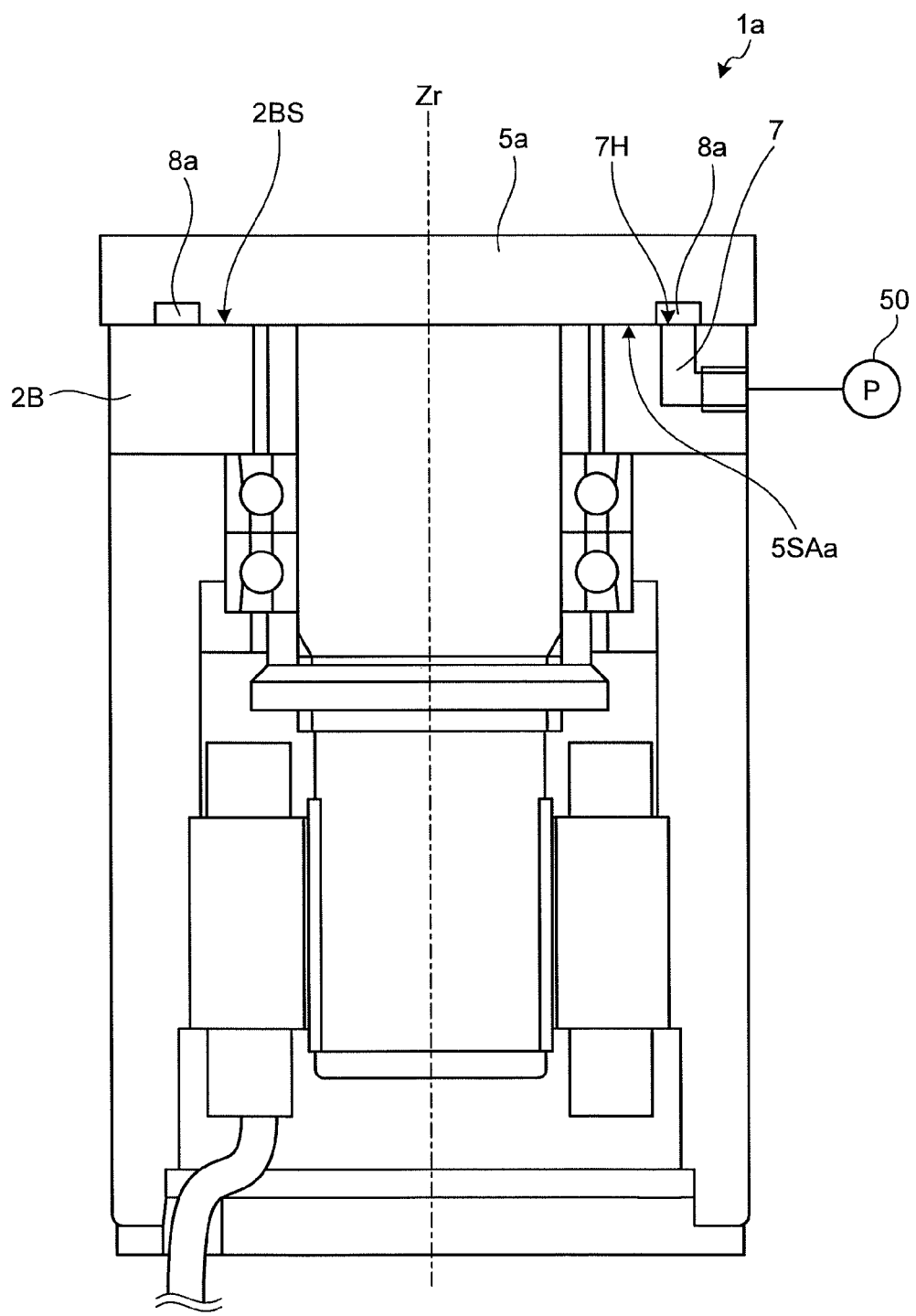
FIG. 6 is a cross-sectional view illustrating a rotation mechanism according to a second embodiment.

FIG. 6 is a cross-sectional view illustrating a rotation mechanism according to a second embodiment. A rotation mechanism 1a of the second embodiment is the same as a rotation mechanism 1 of a first embodiment, but different in including a groove 8a in a rotary member 5a. Other structures of the rotation mechanism 1a are the same as the rotation mechanism 1.

In the rotary member 5a of the rotation mechanism 1a, the groove 8a is provided on a surface 5SAa facing a surface 2BS of the first member 2B. The groove 8a is provided along in a circumferential direction of the rotary member 5a around a rotational center axis Zr. A gas passage 7 is opened at the surface 2BS included in the first member 2B and facing the rotary member 5a. The groove 8a is provided at a position facing an opening portion 7H of the gas passage 7.

The rotation mechanism 1a includes the groove 8a in the rotary member 5a. Therefore, mass of the rotary member 5a is reduced by mass of the groove 8a. As a result, inertia moment of the rotary member 5a is reduced, thereby improving responsiveness of the rotary member 5a. In the present embodiment, the groove 8a is provided only in the rotary member 5a, but additionally a groove 8 as illustrated in FIGS. 1, 2, and 3 may also be provided in a portion located in the first member 2B and facing the groove 8a. Consequently, exhaust efficiency of gas contained in a gap 10 is improved. Therefore, sealing performance can be more improved.

The second embodiment has been described above, but the structure of the second embodiment can be suitably applied to following embodiments as well. In this case, only a partial structure of the second embodiment may be applied or all of the structures may be applied, too.

Third Embodiment

Figure 7:
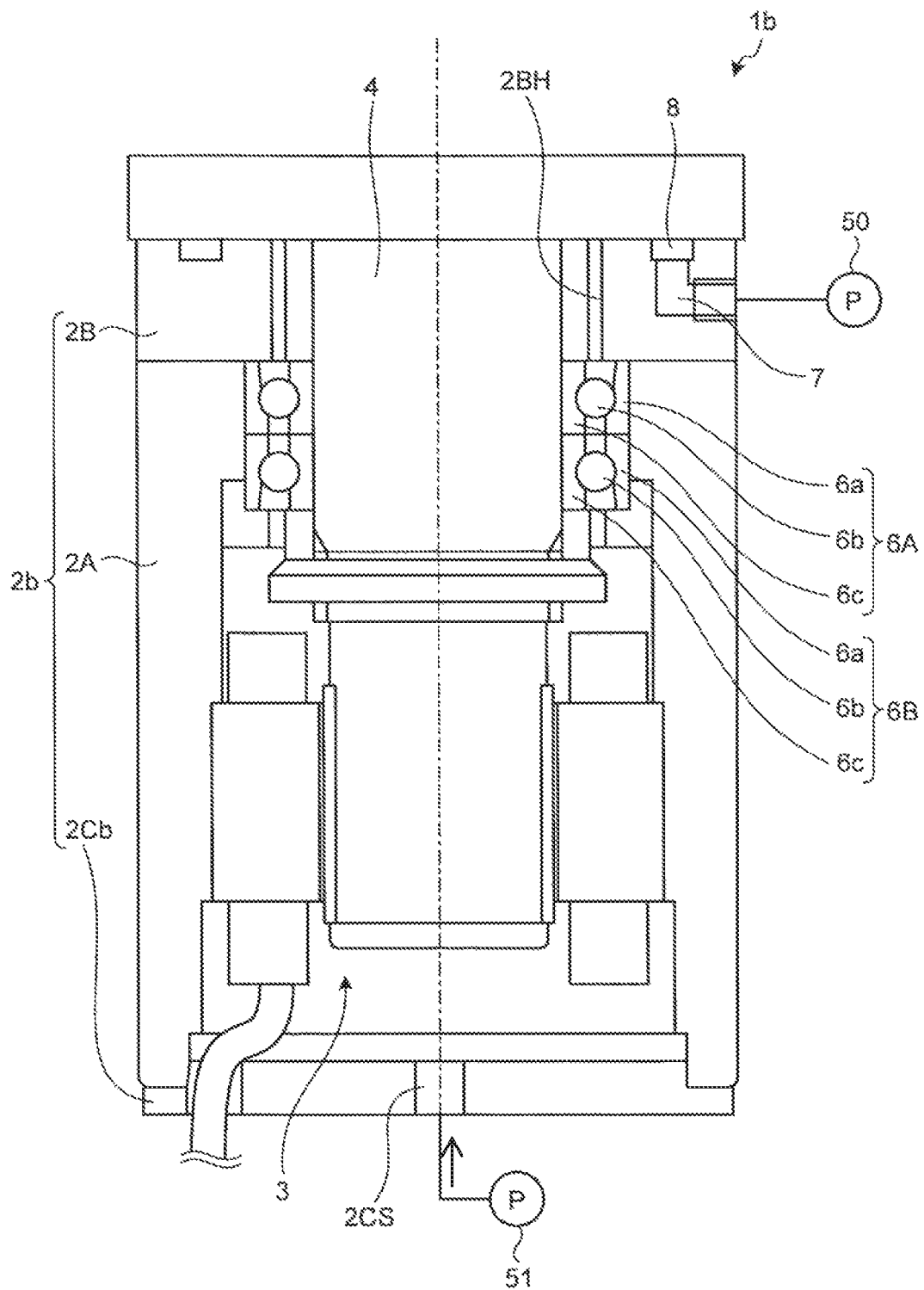
FIG. 7 is a cross-sectional view illustrating a rotation mechanism according to a third embodiment.

FIG. 7 is a cross-sectional view illustrating a rotation mechanism according to a third embodiment. A rotation mechanism 1b of the third embodiment is the same as a rotation mechanism 1 of a first embodiment, but different in that gas is supplied to an electric motor 3 inside a housing 2b. Other structures of the rotation mechanism 1b are the same as the rotation mechanism 1.

A second member 2Cb included in the housing 2b of the rotation mechanism 1b is attached to an end portion (the other end portion) on the electric motor 3 side housed in the housing 2*b*. The second member 2Cb included in the housing 2*b* of the rotation mechanism 1*b* includes a supply port 2CS. The supply port 2CS penetrates the second member 2Cb in a thickness direction thereof. From this supply port 2CS, gas is supplied to the electric motor 3 (in the present embodiment, air).

In the present embodiment, a blower 51 is connected to the supply port 2CS. The blower 51 supplies gas to the electric motor 3 disposed inside the housing 2*b* via the supply port 2CS. The electric motor 3 is cooled by the gas. Furthermore, the gas supplied from the blower 51 also cools bearings 6A, 6B. Therefore, the rotation mechanism 1*b* can suppress heat deformation of the shaft 4. Since heat deformation of the shaft 4 is suppressed, the rotation mechanism 1*b* can rotate the shaft 4 at a high speed.

The rotation mechanism 1*b* may connect the inside of the housing 2*b* not only to the supply port 2CS but also to a vacuum tank or a vacuum generating source with increasing airtightness of the housing 2*b*. The vacuum tank or the vacuum generating source can keep a vacuum state even in the case where an exhaust device 50 is stopped and a sealing function of the gap 10 cannot be kept in an emergency situation such as power failure. With this structure, degradation of the sealing function by the gap 10 can be suppressed in the rotation mechanism 1*b* by connecting the inside of the housing 2*b* to the vacuum tank or the vacuum generating source at the time of power failure or the like. In the case of using this structure, preferably, volume of the portion in the housing 2 in which the electric motor 3 is housed is formed small.

The third embodiment has been described above, but the structure of the third embodiment can be suitably applied to following embodiments as well. In this case, only a partial structure of the third embodiment may be applied or all of the structures may be applied, too.

Fourth Embodiment

Figure 8:
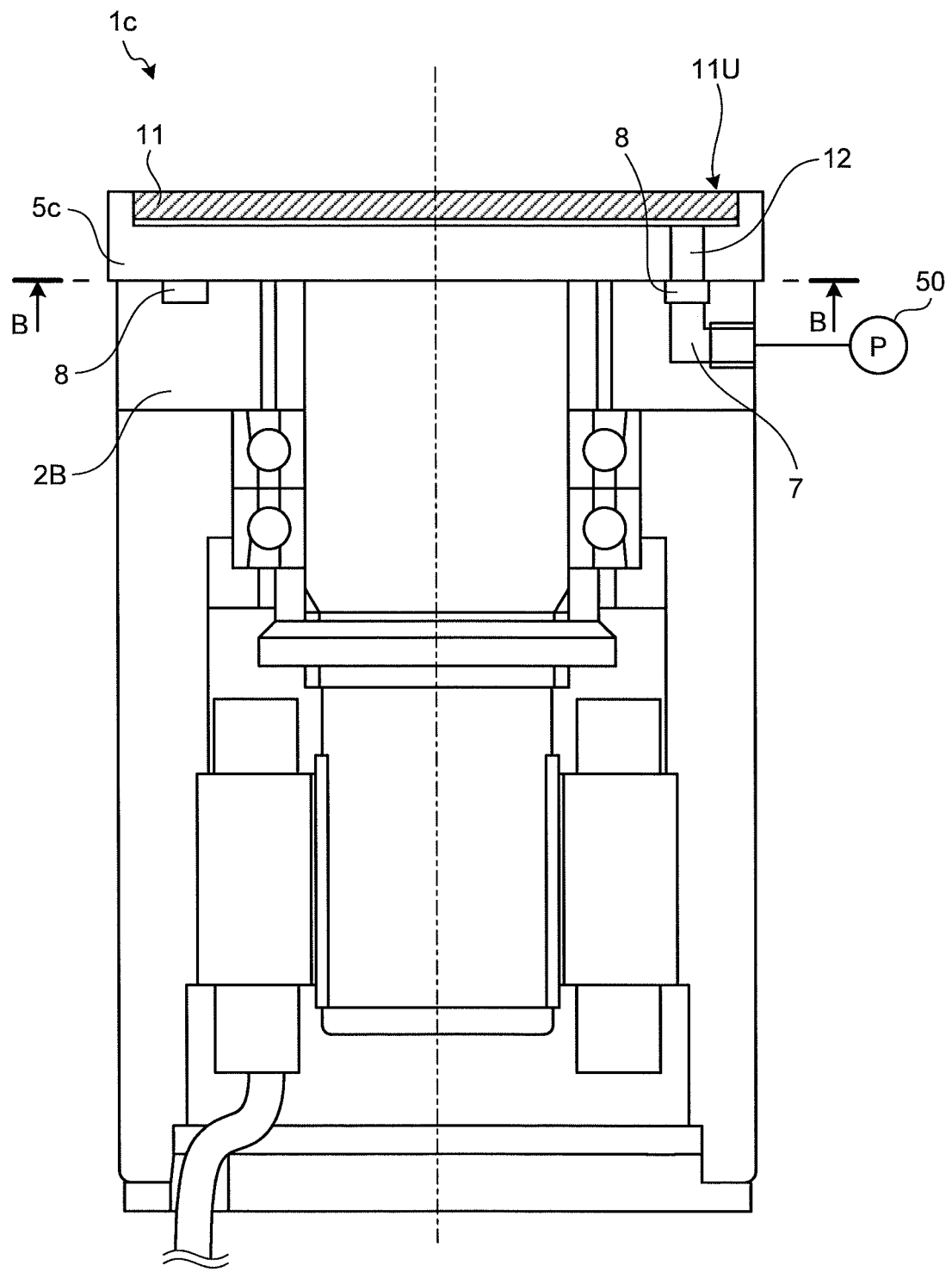
FIG. 8 is a cross-sectional view illustrating a rotation mechanism according to a fourth embodiment.
Figure 9:
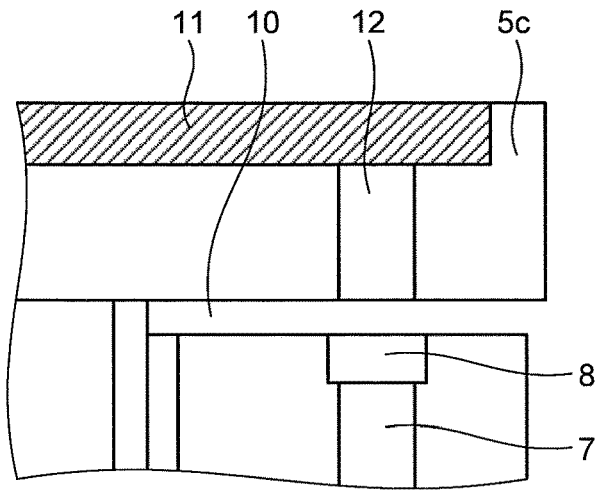
FIG. 9 is an enlarged view illustrating a gap in the rotation mechanism according to the fourth embodiment.
Figure 10:
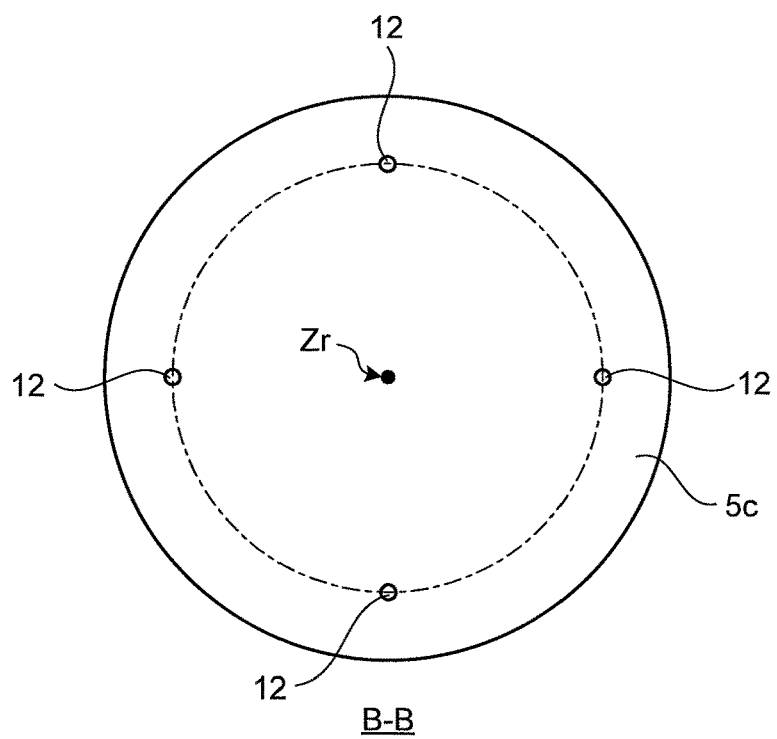
FIG. 10 is a view taken along an arrow B-B in FIG. 8.

FIG. 8 is a cross-sectional view illustrating a rotation mechanism according to a fourth embodiment. FIG. 8 shows a cross-section illustrating a rotation mechanism 1*c* taken along a plane including a rotational center axis Zr of the rotation mechanism 1*c* and parallel to the rotational center axis Zr. FIG. 9 is an enlarged view illustrating a gap in the rotation mechanism according to the fourth embodiment. FIG. 10 is a view taken along an arrow B-B in FIG. 8. The rotation mechanism 1*c* of the fourth embodiment is the same as a rotation mechanism 1 of a first embodiment, but different in that a rotary member 5*c* includes a vacuum chuck mechanism. Other structures of the rotation mechanism 1*c* are the same as the rotation mechanism 1.

The rotary member 5*c* of the rotation mechanism 1*c* includes a recessed portion 11U. A vacuum chuck 11 is provided at the recessed portion 11U. Furthermore, the rotary member 5*c* includes a through-hole 12 penetrating in a thickness direction. The through-hole 12 connects a first member 2B side of a housing 2 to the recessed portion 11U. The through-hole 12 is provided at a position located in the first member 2B and facing a groove 8. In the present embodiment, the rotary member 5*c* includes a plurality of through-holes 12 (four in the present example) along a circumferential direction of the rotary member 5*c* around the rotational center axis Zr. The number of through-holes 12 is not limited and may also be one.

An exhaust device 50 sucks gas (for example, air) from the vacuum chuck 11 through a gas passage 7 provided at the first member 2B, the groove 8, a gap 10, and the through-hole 12 of the rotary member 5*c*. Then, an object loaded on the vacuum chuck 11 is adsorbed thereto. Further, the gap 10 exerts a sealing function by exhaust operation of the exhaust device 50. Thus, in the rotation mechanism 1*c*, a vacuum passage of the vacuum chuck 11 can be sealed by the gap 10. The vacuum chuck 11 may also be a porous body.

The rotation mechanism 1*c* may provide the groove 8 at the rotary member 5*c* same as a second embodiment instead of providing the groove 8 at the first member 2B. Furthermore, the rotation mechanism 1*c* may include a supply port 2CS and a blower 51 to supply cooling gas to an electric motor 3 like a third embodiment.

The fourth embodiment has been described above, but the structure of the fourth embodiment can be suitably applied to following embodiments as well. In this case, only a partial structure of the fourth embodiment may be applied or all of the structures may be applied, too.

Fifth Embodiment

Figure 11:
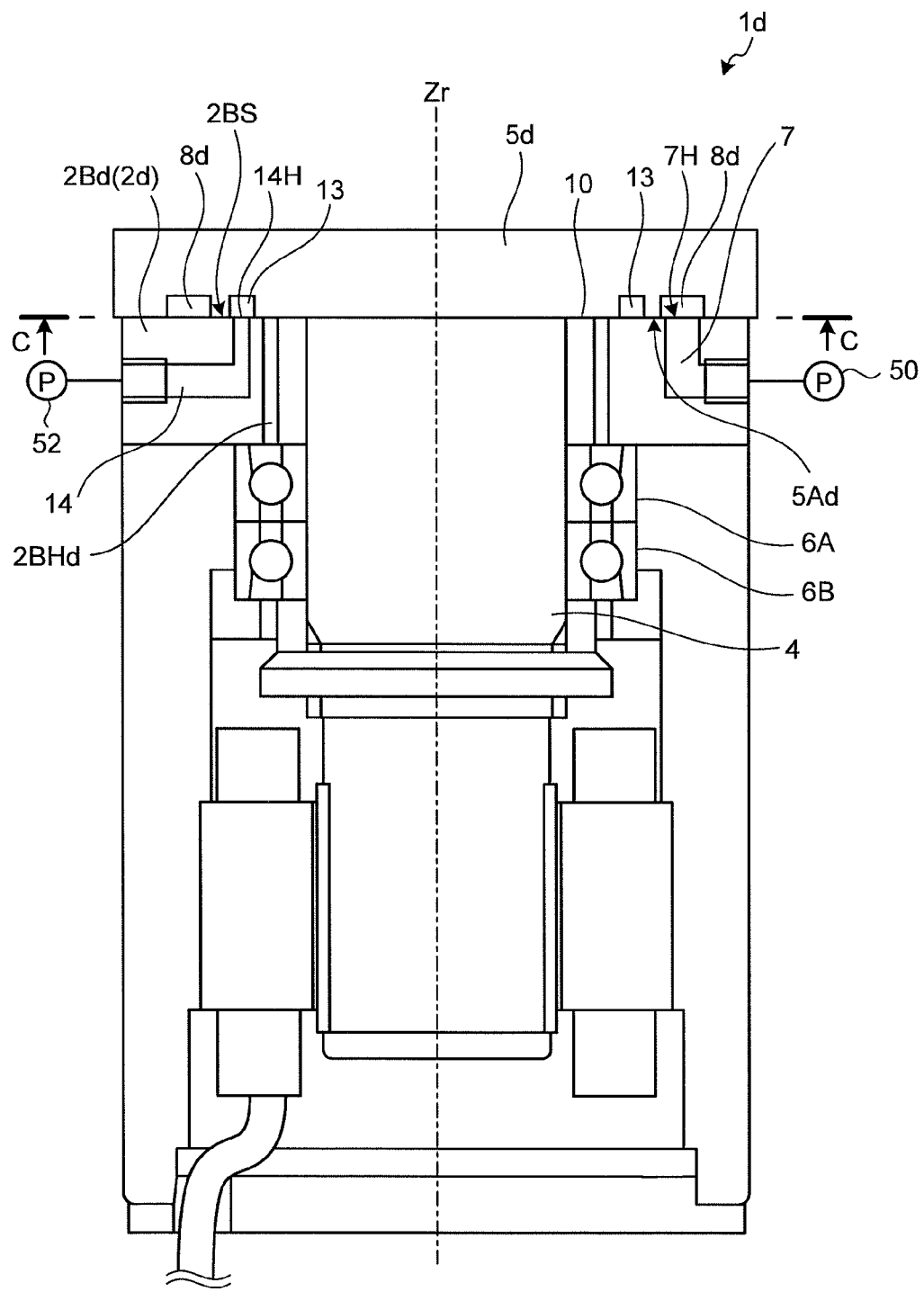
FIG. 11 is a cross-sectional view illustrating a rotation mechanism according to a fifth embodiment.
Figure 12:
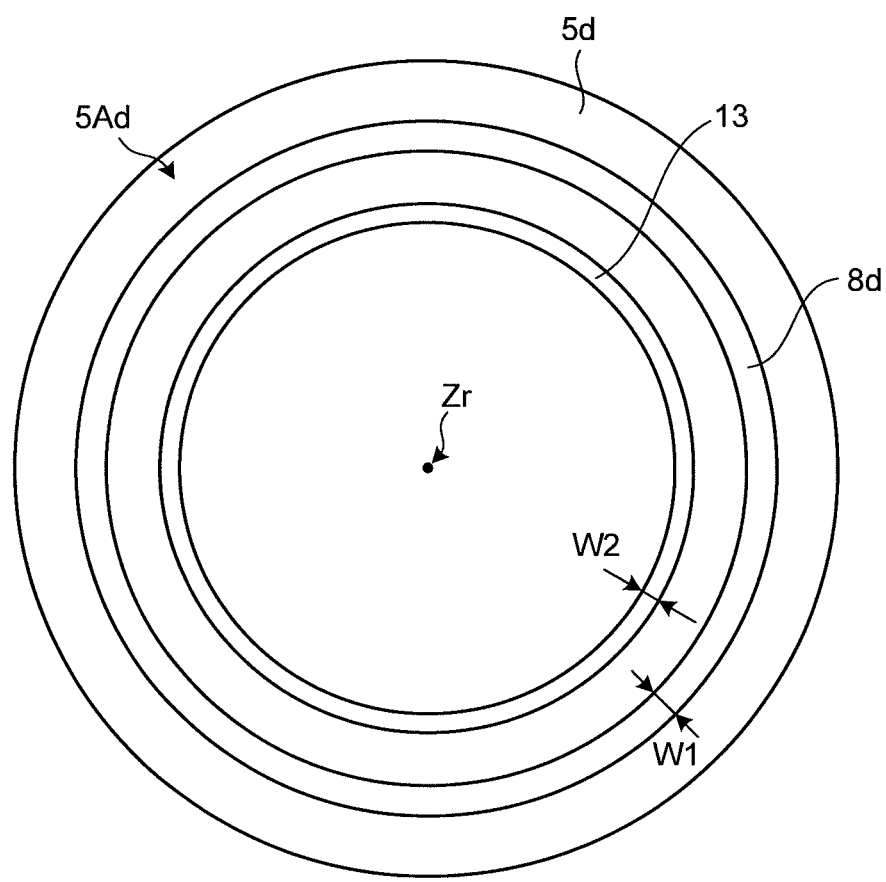
FIG. 12 is a view taken along an arrow C-C in FIG. 11.

FIG. 11 is a cross-sectional view illustrating a rotation mechanism according to a fifth embodiment. FIG. 11 shows a cross-section illustrating a rotation mechanism 1*d* taken along a plane including a rotational center axis Zr of the rotation mechanism 1*d* and parallel to the rotational center axis Zr. FIG. 12 is a view taken along an arrow C-C in FIG. 11. The rotation mechanism 1*d* of the fifth embodiment is the same as a rotation mechanism 1*a* of a second embodiment illustrated in FIG. 6, but different in that a plurality of grooves, a groove 8*d* and a groove 13, is provided at a rotary member 5*d* and a gas passage 7 as well as a gas passage 14 different from the gas passage 7 are provided at a first member 2Bd of a housing 2*d*. Other structures of the rotation mechanism 1*d* are the same as the rotation mechanism 1*a*. In the following, the gas passage 7 will be conveniently referred to as a first gas passage 7 and the gas passage 14 different from the gas passage 7 will be conveniently referred to as a second gas passage 14.

As illustrated in FIGS. 11 and 12, the groove 8*d* and the groove 13 are disposed extending in a circumferential direction of a hole 2BHd included in the first member 2Bd. The groove 8*d* and the groove 13 are provided on a surface 5Ad located in the rotary member 5*d* and facing a surface 2BS of the first member 2Bd in a radial direction of the hole 2BHd. In the present embodiment, the groove 8*d* is provided on a radially outer side of the groove 13. In the present embodiment, both of the groove 8*d* and the groove 13 are provided at the rotary member 5*d*, but both grooves may also be provided at the first member 2Bd of the housing 2*d*, or one of the grooves may be provided at the first member 2B and the other groove may be provided at the rotary member 5*d*. Thus, the rotation mechanism 1*d* may include the plurality of grooves in the radial direction of the hole 2BHd.

The first gas passage 7 and the second gas passage 14 are opened at a surface 2BSd located in the first member 2Bd and facing the rotary member 5*d*. The groove 8*d* is provided at a position facing an opening portion 7H in the first gas passage 7. The groove 13 is provided at a position facing an opening portion 14H of the second gas passage 14. In the present embodiment, a width W1 of the groove 8 is larger than a width W2 of the groove 13 as illustrated in FIG. 12, but a size relation between both grooves is not limited thereto.

In the present embodiment, an exhaust device 52 is connected to the second gas passage 14. The exhaust device 52 sucks and exhausts gas contained inside the second gas passage 14 (in the present embodiment, air). The exhaust device 52 is, for example, a pump. Thus, the gas contained in the second gas passage 14 and the gas contained in the first gas passage 7 are respectively sucked by the different exhaust device 52 and exhaust device 50.

In the present embodiment, the rotation mechanism 1d includes the plurality of grooves, the groove 8d and the groove 13 (two in the present embodiment) in the radial direction of the hole 2BHd included in the first member 2Bd of the housing 2d, thereby improving a sealing function. The exhaust device 50 and the exhaust device 52 suck gas contained in a gap 10 through the first gas passage 7 and the second gas passage 14. The gas contained in the gap 10 is exhausted to the outside of the housing 2d, thereby suppressing entrance of a foreign matter between a shaft 4 and the housing 2d from the outside of the rotation mechanism 1d, entrance of a foreign matter into the bearings 6A, 6B, and outflow of dust from the inside of the housing 2d to the outside of the rotation mechanism 1d. Thus, the rotation mechanism 1d can effectively suppress entrance of a foreign matter from the outside of the shaft 4 by the plurality of grooves, the groove 8d and the groove 13.

Contamination in the gap 10 is caused by mist contained in an outside atmosphere of the housing 2d and liquid splashed toward the rotation mechanism 1d. The liquid may be, for example, cutting oil in a lathe, grinding liquid in a grinder, or the like in a machine tool, and polishing liquid, cleaning liquid, or the like in a semiconductor manufacturing device. The rotation mechanism 1d includes the groove 8d provided on the radially outer side of the hole 2BHd and the groove 13 provided on the radially inner side of the grooves 8d. Therefore, when the gap 10 between the rotary member 5d and the housing 2d is cleaned with cleaning liquid or the like, the rotation mechanism 1d can be supplied with the cleaning liquid from the groove 8d located on the radially outer side, and can collect the cleaning liquid from the groove 8d located on the outer side of the housing 2d and the groove 13 located on the radially inner side. With this structure, the rotation mechanism 1d can suppress entrance of the cleaning liquid into the bearings 6A, 6B.

The fifth embodiment has been described above, but the structure of the fifth embodiment can be suitably applied to following embodiments as well. In this case, only a partial structure of the fifth embodiment may be applied or all of the structures may be applied, too.

Sixth Embodiment

Figure 13:
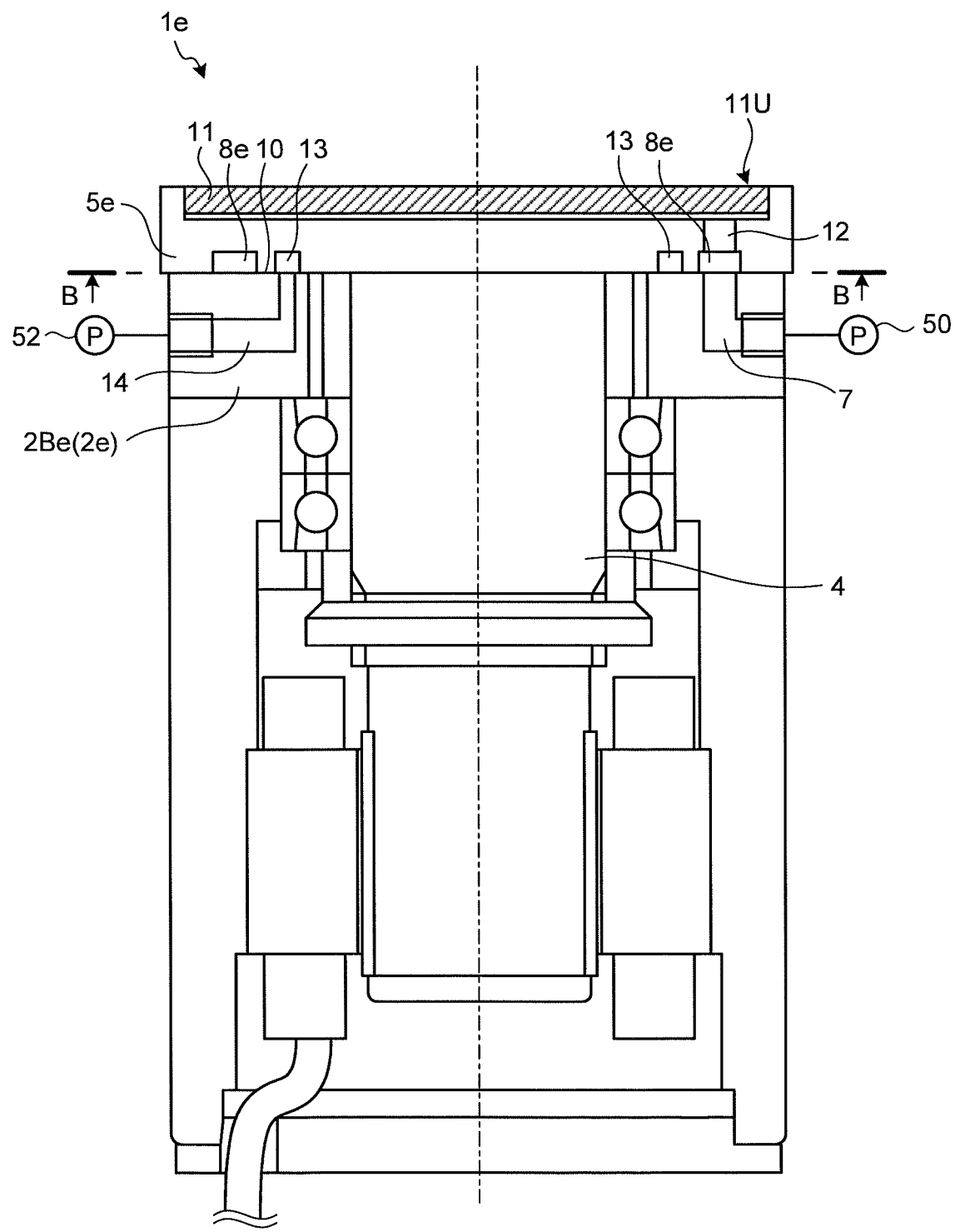
FIG. 13 is a cross-sectional view illustrating a rotation mechanism according to a sixth embodiment.

FIG. 13 is a cross-sectional view illustrating a rotation mechanism according to a sixth embodiment. FIG. 13 shows a cross-section illustrating a rotation mechanism 1e taken along a plane including a rotational center axis Zr of the rotation mechanism 1e and parallel to the rotational center axis Zr. The rotation mechanism 1e of the sixth embodiment is the same as a rotation mechanism 1d of a fifth embodiment illustrated in FIG. 11, but different in that a rotary member 5e includes a vacuum chuck mechanism. Other structures of the rotation mechanism 1e are the same as the rotation mechanism 1d.

The rotary member 5e of the rotation mechanism 1e includes a recessed portion 11U. A vacuum chuck 11 is provided at the recessed portion 11U. Furthermore, the rotary member 5e includes a through-hole 12 penetrating in a thickness direction. The through-hole 12 connects a first member 2Be side of a housing 2e to the recessed portion 11U. The through-hole 12 is provided at a position facing the first gas passage 7 of the first member 2Be. In the present embodiment, the rotary member 5e includes a plurality of through-holes 12 (four in the present example) along a circumferential direction of the rotary member 5e around the rotational center axis Zr. The number of through-holes 12 is not limited and may also be one.

An exhaust device 50 sucks gas (for example, air) from the vacuum chuck 11 through a first gas passage 7 provided at the first member 2Be, a gap 10, the groove 8e, and the through-hole 12 of the rotary member 5e. Then, an object loaded on the vacuum chuck 11 is adsorbed thereto. Furthermore, the gap 10 exerts a sealing function by exhaust operation of the exhaust device 50. Thus, the rotation mechanism 1e can seal a vacuum passage of the vacuum chuck 11 by the gap 10. The vacuum chuck 11 may also be a porous body.

An exhaust device 50 sucks gas (for example, air) from the vacuum chuck 11 through a first gas passage 7 provided at the first member 2B, a gap 10, the groove 8e, and the through-hole 12 of the rotary member 5d. Then, an object loaded on the vacuum chuck 11 is adsorbed thereto. Furthermore, the gap 10 exerts a sealing function by exhaust operation of the exhaust device 50. Thus, the rotation mechanism 1d can seal a vacuum passage of the vacuum chuck 11 by the gap 10. The vacuum chuck 11 may also be a porous body.

In the case of providing an adsorption mechanism such as the vacuum chuck 11 in the rotary member 5e, the rotation mechanism 1e can suck the gas from the vacuum chuck 11 through the first gas passage 7. Further, the rotation mechanism 1e can exhausts gas contained in the gap 10 from a second gas passage 14 different from the first gas passage 7. In this case, an exhaust device 52 sucks the gas from the second gas passage 14. With this structure, an amount of the gas exhausted from the gap 10 is reduced in a gas passage for the vacuum chuck 11, namely, the first gas passage 7. As a result, a flow rate in an exhaust system of the vacuum chuck 11 can be reduced. Since pressure loss is reduced in the exhaust system of the vacuum chuck 11, pressure (chuck pressure) sucked by the vacuum chuck 11 can be increased. For example, flow rates in the first gas passage 7 and second gas passage 14 become substantially half by providing the second gas passage 14. Therefore, pressure loss inside the first gas passage 7 and inside the second gas passage 14 is reduced. In the case of obtaining relatively high chuck pressure, the rotation mechanism 1e can increase the chuck pressure to, for example, 1.1 times compared to a case of including only the first gas passage 7. In the case of requiring the chuck pressure equal to chuck pressure in the case of including only the first gas passage 7, the gap 10 can be formed large in the rotation mechanism 1e.

In the rotation mechanism 1e, the groove 8e and a groove 13 may be provided in a first member 2Be of a housing 2e same as a fifth embodiment instead of providing the groove 8e and the groove 13 in the rotary member 5e. Also, the rotation mechanism 1e may provide either the groove 8e or the groove 13 in the rotary member 5e and may provide, in the housing 2e, the other groove out of the groove 8e or the groove 13 not provided in the rotary member 5e. Furthermore, in the present embodiment, the rotation mechanism 1e does not necessarily include both of the groove 8e and the groove 13. In this case, the through-hole 12 faces an opening portion of the first member 2Be of the first gas passage 7, and the second gas passage 14 sucks gas contained in a portion of the gap 10 from the opening portion of the first member 2Be.

Even when gas suction by the exhaust device 50 is temporarily stopped, the exhaust device 52 can continue sucking the gas from the through-hole 12, the groove 8e, and the groove 13 provided on a radially inner side of the first gas passage 7. Therefore, even when the vacuum chuck 11 is turned off, the rotation mechanism 1e can exhaust the gas in the groove 13 flowing from the bearings 6A, 6B side from the through-hole 12 to the outside of the housing 2e. The rotation mechanism 1e can suppress outflow of the gas and dust contained on the bearings 6A, 6B side to the outside of the housing 2e.

The sixth embodiment has been described above, but the structure of the sixth embodiment can be suitably applied to following embodiments as well. In this case, only a partial structure of the sixth embodiment may be applied or all of the structures may be applied, too.

Seventh Embodiment

Figure 14:
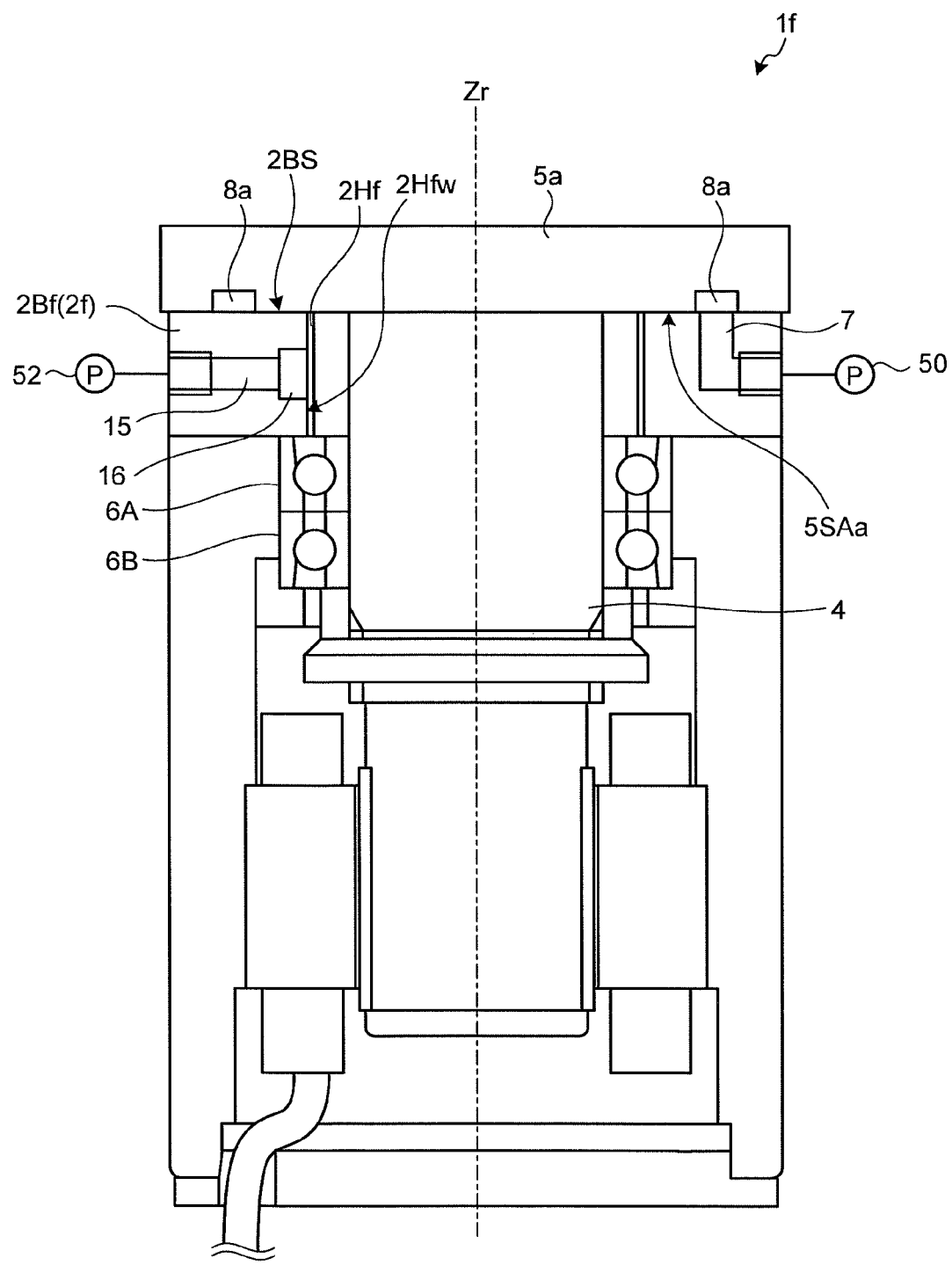
FIG. 14 is a cross-sectional view illustrating a rotation mechanism according to a seventh embodiment.

FIG. 14 is a cross-sectional view illustrating a rotation mechanism according to a seventh embodiment. FIG. 14 shows the cross-section illustrating a rotation mechanism 1f taken along a plane including a rotational center axis Zr of the rotation mechanism 1f and parallel to the rotational center axis Zr. The rotation mechanism 1f of the seventh embodiment is the same as a rotation mechanism 1a of a second embodiment illustrated in FIG. 6, but different in that a housing 2f includes a passage 15 in order to suck gas from between the housing 2f and a shaft 4.

The housing 2f of the rotation mechanism 1f, in the present embodiment, a first member 2Bf includes the passage 15. The passage 15 is a passage extending in a radial direction of the first member 2Bf. The passage 15 passes through a side portion on a radially outer side of the first member 2Bf and a through-hole 2Hf, and connects the outside of the first member 2Bf to the inside of the through-hole 2Hf. In the present embodiment, the through-hole 2Hf includes, on an inner peripheral surface 2Hfw, a groove 16 extending in a circumferential direction of the through-hole 2Hf. The passage 15 is opened to the groove 16. In the present embodiment, the number of passage 15 is one, but the number of passage 15 is not limited thereto.

In a groove 13 of a sixth embodiment described above, an inner vacuum level can be relatively low. Therefore, the gap 10 in a portion provided with the groove 13 may have a relatively large size, for example, from several μm to several tens of μm as described above. Therefore, in the rotation mechanism 1f, the groove 16 is provided on the inner peripheral surface 2Hfw of the through-hole 2Hf instead of providing the groove 13 at the rotary member 5a or the first member 2Bf. Furthermore, an exhaust device 52 sucks gas from between the first member 2Bf of the housing 2f and the shaft 4 through the passage 15 opened to the groove 16. For example, the exhaust device 52 sucks the gas from between the first member 2Bf and the shaft 4 through the passage 15 while the gap 10 is cleaned with cleaning liquid. Therefore, entrance of the cleaning liquid into bearings 6A, 6B can be suppressed. In the present embodiment, the groove 16 is provided on the inner peripheral surface 2Hfw of the through-hole 2Hf, but the groove 16 is not necessarily provided at the through-hole 2Hf.

Eighth Embodiment

Figure 15:
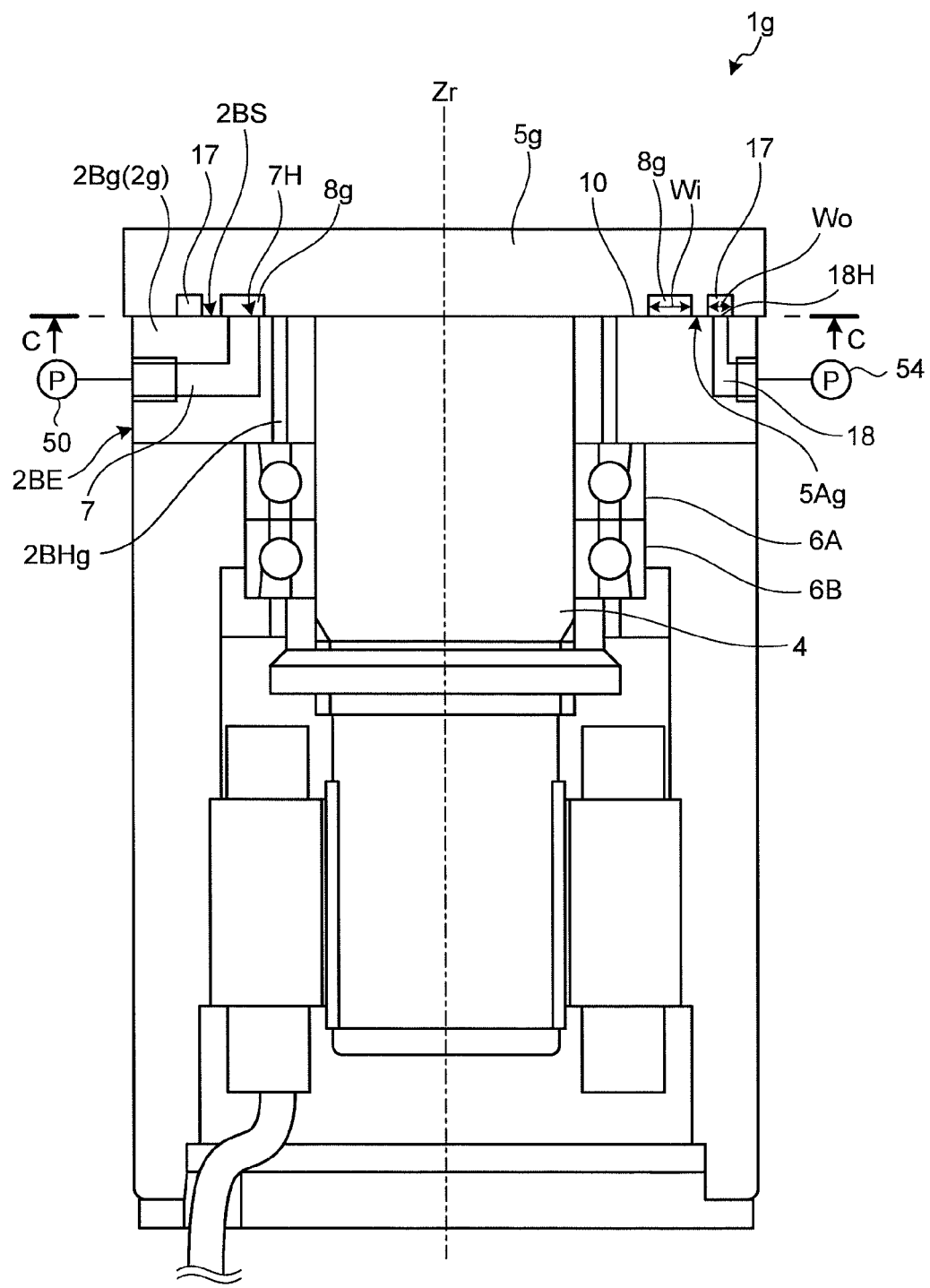
FIG. 15 is a cross-sectional view illustrating a rotation mechanism according to an eighth embodiment.

FIG. 15 is a cross-sectional view illustrating a rotation mechanism according to an eighth embodiment. FIG. 15 shows a cross-section illustrating a rotation mechanism 1g taken along a plane including a rotational center axis Zr of the rotation mechanism 1g and parallel to the rotational center axis Zr. The rotation mechanism 1g of the eighth embodiment includes a gas passage 7 and a supply passage 18. The gas passage 7 connects a gap 10 to outside of a housing 2g, and allows gas contained in the gap 10 portion to pass to the outside of the housing 2g. In the following, the gas passage 7 will be conveniently referred to as an exhaust passage 7. The supply passage 18 connects the gap 10 to the outside of the housing 2g, and supplies gas to the portion of the gap 10 from a more radially outer side of a hole 2BHg than the gas passage 7.

The supply passage 18 connects the surface 2BS located in a first member 2Bg and facing a rotary member 5g to a side portion 2BE linked to the surface 2BS, and the supply passage 18 passes through the first member 2Bg. The supply passage 18 is opened to the surface 2BS located in the first member 2Bg and facing the rotary member 5g. With this structure, the supply passage 18 connects the gap 10 to the outside of the housing 2g and supplies gas to the portion of the gap 10. In the present embodiment, a supply device 54 is connected to the supply passage 18. The supply device 54 supplies gas (in the present embodiment, air) to the supply passage 18. The supply device 54 is a pump, for example, and supplies the supply passage 18 with the gas having pressure higher than a periphery of the housing 2g.

In the present embodiment, a portion located in the rotary member 5g and facing the first member 2Bg of the housing 2g, namely, a surface 5Ag of the rotary member 5g is provided with a first groove 8g and a second groove 17. Both of the first groove 8g and the second groove 17 extend in a circumferential direction of the hole 2BHg. The second groove 17 is provided on a more radially outer side of the hole 2BHg than the first groove 8g. In the present embodiment, both of the first groove 8g and the second groove 17 are concentric around the rotational center axis Zr.

An opening portion 7H of the exhaust passage 7 faces the first groove 8g, and an opening portion 18H of the supply passage 18 faces the second groove 17. The exhaust passage 7 connects the gap 10 to the outside of the housing 2g at a position of the first groove 8g, and the supply passage 18 connects the gap 10 to the outside of the housing 2g at a position of the second groove 17. In the present embodiment, both of the first groove 8g and the second groove 17 are provided at the rotary member 5g, but may also be provided at the first member 2Bg included in the housing 2g. More specifically, the first groove 8g and the second groove 17 may also be provided at least one of a portion located in the first member 2Bg of the housing 2g and facing the rotary member 5g, and a portion located in the rotary member 5g and facing the first member 2Bg of the Housing 2g.

The opening portion 18H at the first member 2Bg of the supply passage 18 is opened on a more radially outer side of the hole 2BHg than the opening portion 7H at the first member 2Bg of the exhaust passage 7. With this structure, the rotation mechanism 1g can suppress entrance of a foreign matter such as liquid from the outside of the housing 2g into the gap 10 and the radially inner side of the second groove 17 with the gas supplied by the supply device 54 to the gap 10 through the second groove 17 from the supply passage 18. An exhaust device 50 sucks high-pressure gas supplied to the gap 10 from the supply passage 18 through the exhaust passage 7 and the first groove 8g, and exhausts the gas from the same the gap 10 to the outside of the housing 2g. Therefore, the rotation mechanism 1g can suppress the high-pressure gas supplied from the supply passage 18 from flowing into the bearing 6A, 6B inside the housing 2g.

The rotation mechanism 1g does not necessarily include the first groove 8g and the second groove 17. However, by providing the first groove 8g and the second groove 17, the rotation mechanism 1g can efficiently fill the high-pressure gas to the gap 10 across the rotary member 5g and an entire peripheral area of the first member 2Bg of the housing 2g, and furthermore can effectively exhaust the gas from the gap 10. Therefore, it is preferable to include the first groove 8g and the second groove 17.

In the present embodiment, a width Wi of the first groove 8g is larger than a width Wo of the second groove 17. With this structure, the exhaust passage 7 can suck the gas contained in the gap 10 from a wide area in the radial direction of the first groove 8g. Therefore, liquid, gas, or the like can be effectively suppressed from being directed to the bearings 6A, 6B side over the first groove 8g.

Preferably, the gap 10 on the radially outer side of the second groove 17 is larger than a gap on the radially inner side of the second groove 17. With this structure, the rotation mechanism 1g can effectively emit, to the outside of the housing 2g, the gas supplied to the second groove 17.

The rotation mechanism 1g may include a vacuum chuck 11 illustrated in FIG. 13. In this case, a through-hole 12 illustrated in FIG. 13 is connected to the first groove 8g. An exhaust device 50 can adsorb an object to the vacuum chuck 11 by sucking the gas through the through-hole 12, first groove 8g, and exhaust passage 7 illustrated in FIG. 13.

The rotation mechanism 1g provides high performance to seal the inside of the housing 2g. Therefore, use in an environment in which liquid is sprayed to the shaft 4 is preferable. Furthermore, the rotation mechanism 1g is suitable to be used in a case of an environment in which the gap 10 is formed small due to gas or liquid sucked from the periphery of the housing 2g is accumulated on the first member 2Bg of the housing 2g or a surface of the rotary member 5g.

The eighth embodiment has been described above, but the structure of the eighth embodiment can be suitably applied to following embodiments as well. In this case, only a partial structure of the eighth embodiment may be applied or all of the structures may be applied, too.

Ninth Embodiment

Figure 16:
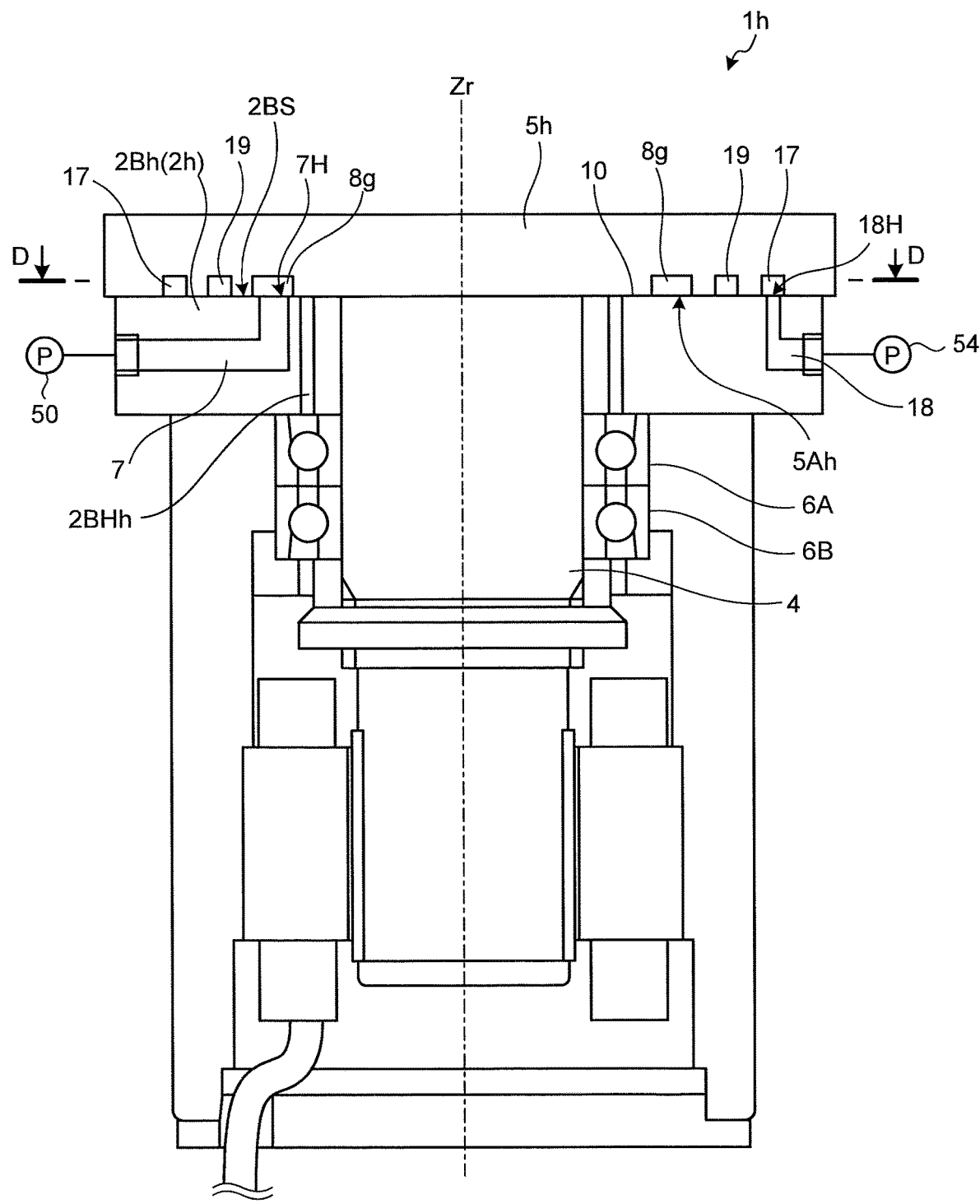
FIG. 16 is a cross-sectional view illustrating a rotation mechanism according to a ninth embodiment.
Figure 17:
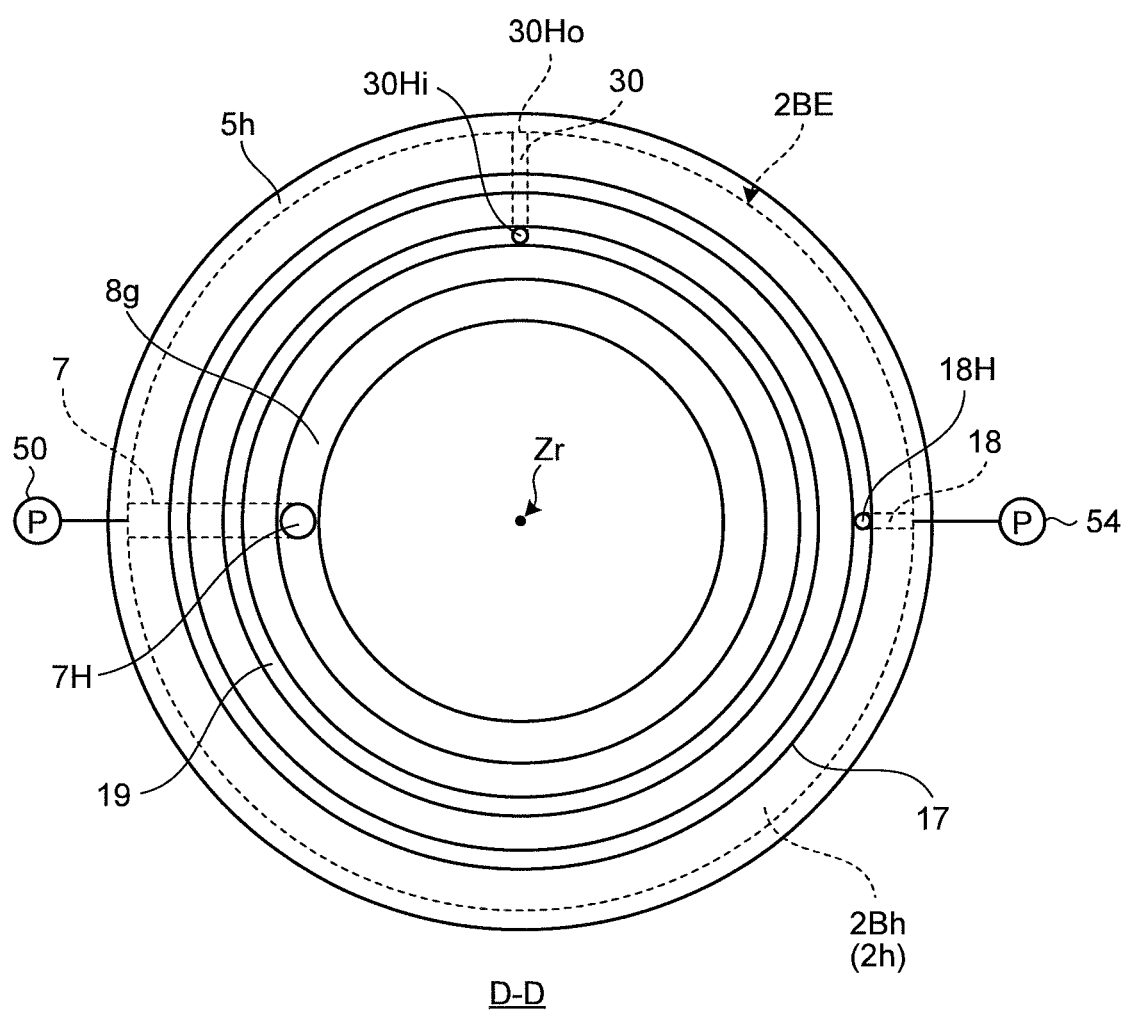
FIG. 17 is a view taken along an arrow D-D in FIG. 16.

FIG. 16 is a cross-sectional view illustrating a rotation mechanism according to a ninth embodiment. FIG. 17 is a view taken along an arrow D-D in FIG. 16. This rotation mechanism 1h is the same as a rotation mechanism 1g of an eighth embodiment, but different in including a third groove 19 between a first groove 8g and a second groove 17. Other structures of the rotation mechanism 1h are the same as the rotation mechanism 1g.

The third groove 19 extends in a circumferential direction of a hole 2BHh, and is connected to outside of a first member 2Bh of a housing 2h. In the present embodiment, the third groove 19 is provided on a surface 5Ah located in a rotary member 5h and facing the first member 2Bh of the housing 2h, but may also be provided on a surface 2BS located in the first member 2Bh of the housing 2h and facing the rotary member 5h. The third groove 19 may also be provided on the surface 5Ah of the rotary member 5h and the surface 2BS of the first member 2Bh of the housing 2h. Thus, the third groove 19 is provided in at least one of a portion located in the housing 2h and facing the rotary member 5h, and a portion located in the rotary member 5h and facing the housing 2h.

As illustrated in FIG. 17, the first member 2Bh of the housing 2h includes a passage 30. The first member 2Bh includes an opening portion 30Hi of the passage 30 at a portion facing the third groove 19. Further, the first member 2Bh includes an opening portion 30Ho of the passage 30 at a side portion 2BE. With this structure, the passage 30 allows communication between a gap 10, which is located between the rotary member 5h and the first member 2Bh of the housing 2h, and the outside of the first member 2Bh of the housing 2h illustrated in FIG. 16.

A flow rate of gas that flows to an exhaust passage 7 from the first groove 8g (hereinafter, conveniently referred to as exhausting flow rate) is increased in accordance with pressure of high-pressure gas supplied from a supply passage 18 to the second groove 17. The third groove 19 collects the high-pressure gas flowing out from the second groove 17 and emits the gas from the passage 30 to the outside of the housing 2h. Therefore, the third groove 19 can reduce the exhausting flow rate. The rotation mechanism 1h of the present embodiment can efficiently emit the gas supplied from the second groove 17 to the outside of the housing 2h without forming the gap 10 on a radially outer side larger than the gap 10 on a radially inner side of the second groove 17.

The rotation mechanism 1h may include a vacuum chuck 11 illustrated in FIG. 13. In this case, a through-hole 12 illustrated in FIG. 13 is connected to the first groove 8g. An exhaust device 50 can adsorb an object to the vacuum chuck 11 by sucking the gas through the through-hole 12, first groove 8g, and exhaust passage 7 illustrated in FIG. 13. Since the rotation mechanism 1h can reduce the exhausting flow rate by the third groove 19, chuck pressure can be increased if exhausting performance of the exhaust device 50 is equal to those in a case without the third groove 19. When the chuck pressure is equal to those in a case without the third groove 19, the exhaust performance of the exhaust device 50 can be small.

The ninth embodiment has been described above, but the structure of the ninth embodiment can be suitably applied to following embodiment as well. In this case, only a partial structure of the ninth embodiment may be applied or all of the structures may be applied, too.

Tenth Embodiment

Figure 18:
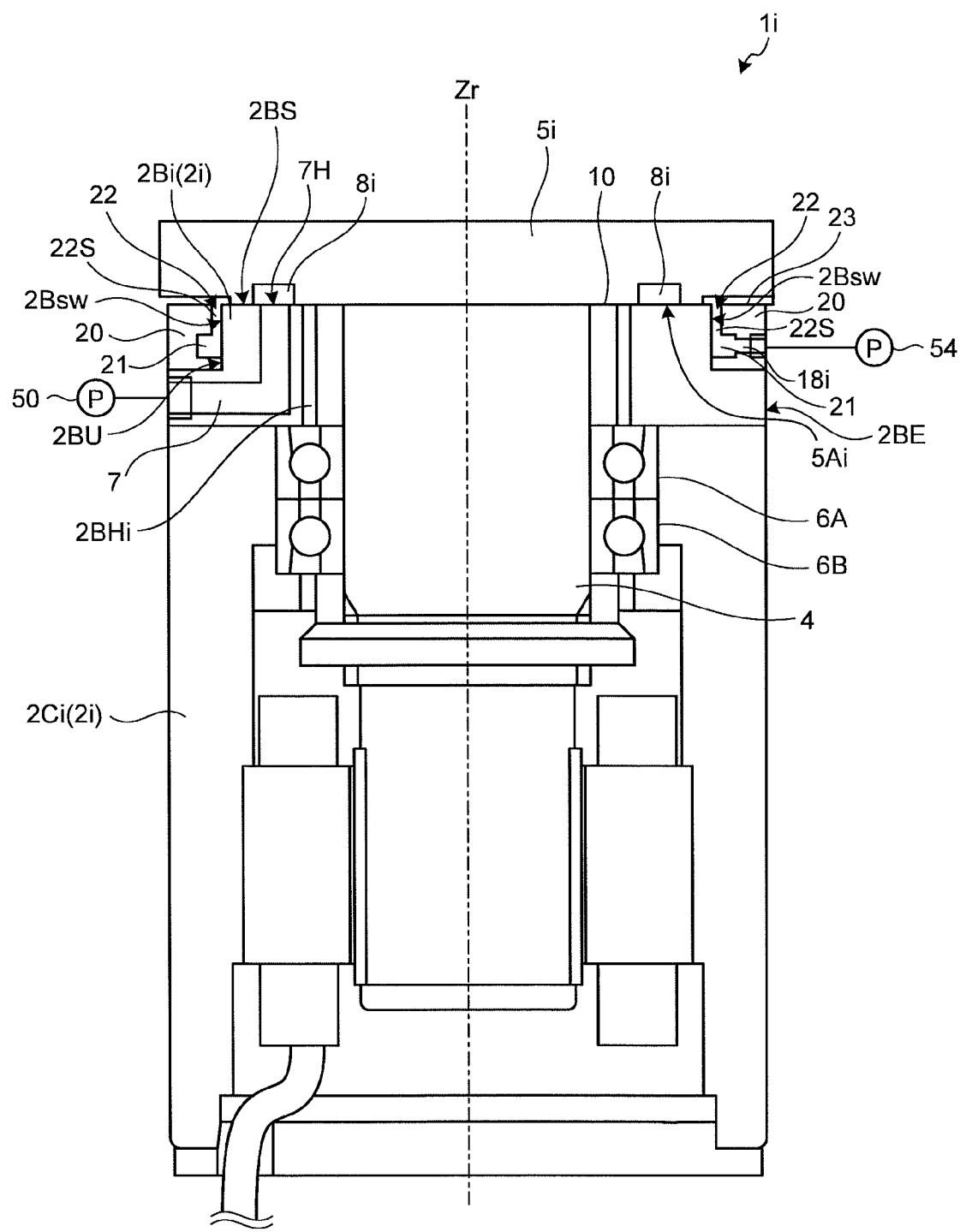
FIG. 18 is a cross-sectional view illustrating a rotation mechanism according to a tenth embodiment.

FIG. 18 is a cross-sectional view illustrating a rotation mechanism according to a tenth embodiment. The rotation mechanism 1i includes, in a housing 2i, an opening portion 22 opened on a more radially outer side of a hole 2BHi than an exhaust passage 7, facing a rotary member 5i, and extending in a circumferential direction of the hole 2BHi. A supply passage 18i is connected to the opening portion 22.

A first member 2Bi of the housing 2i included in the rotation mechanism 1i include, on a side portion 2BE, a recessed portion 2BU formed in a circumferential direction. An annular member 20 is attached to the recessed portion 2BU. The annular member 20 contacts an outer peripheral surface 2Bsw of the recessed portion 2BU on a second member 2Ci side of the housing 2i. A gap 22S is formed in a space between the rotary member 5i side of the annular member 20 and the outer peripheral surface 2Bsw of the recessed portion 2BU. This gap 22S is formed as the opening portion 22 opened to a surface 2BS located in the first member 2Bi of the housing 2i on the rotary member 5i side. For example, a slot throttle of a gas bearing can be utilized for the gap 22S.

The annular member 20 includes a groove 21 formed on an inner peripheral surface along a circumferential direction. The groove 21 is connected to the gap 22S and the supply passage 18i. When a supply device 54 supplies gas to the gap 22S through the groove 21 from the supply passage 18i, the gas can be uniformly injected from the opening portion 22 to between the rotary member 5i and the first member 2Bi in circumferential directions thereof. For example, even in the case where the number of the supply passage 18i is one, the gap 22S and the opening portion 22 can uniformly inject the gas in the circumferential directions of the rotary member 5i and the first member 2Bi. The gas is emitted to the outside of the housing 2i, thereby achieving sealing. In the case of intending to increase a width of the opening portion 22 in order to uniformly inject the gas, an adjustment apparatus to control a flow rate of the gas flowing into the gap 22S can be provided at the supply passage 18i or a passage connected thereto.

The rotary member 5i includes a groove 8i extending in a circumferential direction of the hole 2BHi on a surface 5Ai located in the rotary member 5i and facing the first member 2Bi of the housing 2i. The groove 8i may also be provided on the surface 2BS located in the first member 2Bi of the housing 2i and facing the rotary member 5i, and may also be provided at both of the rotary member 5i and the first member 2Bi. An opening portion 7H of the exhaust passage 7 faces the groove 8i, and an exhaust device 50 sucks gas contained inside a gap 10 and the groove 8i through the exhaust passage 7.

The rotation mechanism 1i includes a gap 23 between the rotary member 5i and the annular member 20. The gap 23 is connected to the opening portion 22. With this structure, the gas flowing out from the opening portion 22 is efficiently exhausted to the outside of the housing 2i through the gap 23. Therefore, the rotation mechanism 1g can reduce a flow rate of high-pressure gas which is supplied from the supply passage 18i to flow into the exhaust passage 7 through the groove 8i. Further, the rotation mechanism 1i can reduce diameters of a rotary member 5h and a first member 2Bh of a housing 2h, compared to a rotation mechanism 1h of a ninth embodiment illustrated in FIG. 16.

While the first to tenth embodiments have been described above, the first to tenth embodiments are not limited by the matters described above. Furthermore, the above-described components include those readily conceivable by men skilled in the art, those substantially identical therewith, and those included in a so-called equivalent range. Moreover, the above-described components can be suitably combined. Additionally, at least one of various kinds of omission, replacement, and modifications can be made with respect to the components in a range without departing from the gist of the first to tenth embodiments.

REFERENCE SIGNS LIST 1, 1a, 1b, 1c, 1d, 1e, 1f, 1g, 1h, 1i ROTATION MECHANISM
2, 2b, 2d, 2e, 2f, 2g, 2h, 2i HOUSING
2CS SUPPLY PORT
2BH, 2BHd HOLE
2A SIDE PORTION
2B, 2Bd, 2Be, 2Bf, 2Bg, 2Bh, 2Bi FIRST MEMBER
2C, 2Cb SECOND MEMBER
2I THROUGH-HOLE
2Hfw INNER PERIPHERAL SURFACE
3 ELECTRIC MOTOR
4 SHAFT
4S, 9 SPACER
5, 5a, 5c, 5d, 5e, 5g, 5h, 5i ROTARY MEMBER
5f PORTION THAT PROJECTS TO THE RADIALLY OUTER SIDE OF THE HOLE
6A, 6B BEARING
6a OUTER RING
6b ROLLING ELEMENT
6c INNER RING
7 GAS PASSAGE (FIRST GAS PASSAGE, EXHAUST PASSAGE)
7H OPENING PORTION
8, 8a, 8d, 8e, 8g, 8i, 13, 16 GROOVE
8g FIRST GROOVE
10, 22S, 23 GAP
11 VACUUM CHUCK
12 THROUGH-HOLE
14 GAS PASSAGE (SECOND GAS PASSAGE)
15 PASSAGE
17 SECOND GROOVE
18 SUPPLY PASSAGE
19 THIRD PASSAGE
20 ANNULAR MEMBER
22 OPENING PORTION
50, 52 EXHAUST DEVICE
54 SUPPLY DEVICE
51 BLOWER
BLT BOLT

The invention claimed is:
1. A rotation mechanism comprising:
a housing including an inner wall and a top surface;
a shaft inserted through a hole provided at the housing;
a bearing attached to the inner wall of the housing installed at the housing and configured to rotatably support the shaft,
wherein the bearing is a rolling bearing including an outer ring, an inner ring disposed on a radially inner side of the outer ring, and a rolling element disposed between the outer ring and the inner ring,
wherein the outer ring is attached to the inner wall of the housing, and the inner ring is attached to an outer surface of the shaft, allowing to determine a position of the housing relative to the shaft in a rotational center axis direction,
wherein the rotation mechanism further comprises a plate like rotary member provided at one end portion of the shaft, configured to be rotated together with the shaft, and having an outer rotary portion that projects to a radially outer side of the hole and faces the housing,
wherein the rotation mechanism includes a gap that has a gap width in the rotational center axis direction and that is defined by a lower surface of the outer rotary portion and the top surface of the housing, a position of the top surface being allowed to be determined relative to the shaft in the rotational center axis direction,
wherein the rotation mechanism further comprises a gas passage that is open to the top surface defining the gap, to connect the gap to an outside of the housing,
wherein a groove extending in a circumferential direction of the hole is provided at a portion located in the rotary plate member and faces the housing,
wherein the gas passage is provided in the housing and opened to a position located in the rotary plate member and faces the groove, and
wherein the gap having the gap width is a sealing portion to seal a space between an inside and the outside of the housing and is connected to the gas passage, the gas passage allowing gas contained in a portion of the gap to pass to the outside of the housing through the groove located in the rotary plate member, the gap, and the gas passage that are connected, wherein a plurality of grooves is provided in the rotary plate member, the plurality of grooves including the groove, as a first groove, and a second groove, and a width of the first groove is different from a width of the second groove.

2. The rotation mechanism according to claim 1, wherein the hole surrounding the shaft is opened between the outer ring and the inner ring on the rotary plate member side.

3. The rotation mechanism according to claim 1, wherein the housing includes, inside, an electric motor having a rotor connected to the other end portion of the shaft, and
cooling gas is supplied to the electric motor.

4. The rotation mechanism according to claim 1,
wherein a through-hole penetrating the rotary plate member in a thickness direction is provided, and
wherein gas is exhausted from the rotary plate member on an opposite side of the housing to the outside of the housing through the through-hole, the gap, the groove, and the gas passage that are connected.

5. The rotation mechanism according to claim 4, wherein the housing includes a plurality of gas passages including the gas passage, as a first gas passage, and a second gas passage that is a gas passage other than the first gas passage, and
the first gas passage and the second gas passage allow gas contained in a portion of the gap to pass to the outside of the housing.

6. The rotation mechanism according to claim 1, wherein the housing includes a plurality of gas passages including:
the gas passage, as a first gas passage, that allows gas contained in the portion of the gap to pass to the outside of the housing, and
a second gas passage to suck gas from between the housing and the shaft.

7. The rotation mechanism according to claim 1, including a supply passage configured to connect the gap to the outside of the housing and supply gas to a portion of the gap from a portion located on a more radially outer side of the hole than the gas passage.

8. The rotation mechanism according to claim 7,
wherein the plurality of grooves is provided in a radial direction of the hole,
wherein the second groove is disposed on a more radially outer side of the hole than the first groove and extends in a circumferential direction of the hole,
wherein the gas passage connects the gap to the outside of the housing at a position of the first groove,
wherein the supply passage connects the gap to the outside of the housing at a portion of the second groove, and
a width of the first groove, that is an inner groove coupled to the gas passage to exhaust gas from the gap, is larger than a width of the second groove, that is an outer groove that is coupled to the supply passage to supply gas.

9. The rotation mechanism according to claim 8,
wherein the plurality of grooves further include a third groove that is positioned between the first groove and the second groove and that extends in a circumferential direction of the hole, and
wherein the third groove is connected to the outside of the housing.

10. The rotation mechanism according to claim 7, including, in the housing, an opening portion opened on a more radially outer side of the hole than the gas passage, facing the rotary plate member, and extending in a circumferential direction of the hole,
wherein the supply passage is connected to the opening portion.

11. A machine tool including the rotation mechanism according to claim 1.

12. A semiconductor manufacturing device including the rotation mechanism according to claim 1.

13. The rotation mechanism according to claim 5,
wherein the plurality of grooves is provided in a radial direction of the hole,
wherein the second groove is disposed on a more radially inner side of the hole than the first groove and extends in a circumferential direction of the hole, and
wherein the first gas passage connects the gap to the outside of the housing at a position of the first groove,
wherein the second gas passage connects the gap to the outside of the housing at a position of the second groove,
a width of the first groove, that is an outer groove and that is coupled to the first gas passage to exhaust gas from the gap, is larger than a width of the second groove, that is an inner groove that is coupled to the second gas passage to exhaust gas from the gap.

* * * * *